US009559720B2

(12) United States Patent
Marwah et al.

(10) Patent No.: US 9,559,720 B2
(45) Date of Patent: *Jan. 31, 2017

(54) COMPRESSION ANALYZER

(71) Applicant: Oracle International Corporation, Redwood Shores, CA (US)

(72) Inventors: Vineet Marwah, San Ramon, CA (US); Vikram Kapoor, Cupertino, CA (US); Amit Ganesh, San Jose, CA (US); Jesse Kemp, San Leandro, CA (US); Sachin Kulkarni, Foster City, CA (US); Roger Macnicol, Hollis, NH (US); Kam Shergill, Berkshire (GB); Manosiz Bhattacharyya, San Jose, CA (US)

(73) Assignee: Oracle International Corporation, Redwood Shores, CA (US)

( * ) Notice: Subject to any disclaimer, the term of this patent is extended or adjusted under 35 U.S.C. 154(b) by 965 days.

This patent is subject to a terminal disclaimer.

(21) Appl. No.: 13/631,575

(22) Filed: Sep. 28, 2012

(65) Prior Publication Data

US 2013/0036101 A1 Feb. 7, 2013

Related U.S. Application Data

(63) Continuation of application No. 12/769,508, filed on Apr. 28, 2010, now Pat. No. 8,356,060, which is a (Continued)

(51) Int. Cl.
*G06F 17/30* (2006.01)
*H03M 7/30* (2006.01)

(52) U.S. Cl.
CPC .......... *H03M 7/30* (2013.01); *G06F 17/30595* (2013.01)

(58) Field of Classification Search
None
See application file for complete search history.

(56) References Cited

U.S. PATENT DOCUMENTS 5,255,356 A 10/1993 Michelman et al.
5,263,145 A 11/1993 Brady et al.
(Continued)

OTHER PUBLICATIONS

U.S. Appl. No. 12/791,337, filed Jun. 1, 2010, Final Office Action, Nov. 26, 2012.

(Continued)

*Primary Examiner* — Sangwoo Ahn
(74) *Attorney, Agent, or Firm* — Hickman Palermo Becker Bingham LLP

(57) ABSTRACT

Techniques are described herein for automatically selecting the compression techniques to be used on tabular data. A compression analyzer gives users high-level control over the selection process without requiring the user to know details about the specific compression techniques that are available to the compression analyzer. Users are able to specify, for a given set of data, a "balance point" along the spectrum between "maximum performance" and "maximum compression". The point thus selected is used by the compression analyzer in a variety of ways. For example, in one embodiment, the compression analyzer uses the user-specified balance point to determine which of the available compression techniques qualify as "candidate techniques" for the given set of data. The compression analyzer selects the compression technique to use on a set of data by actually testing the candidate compression techniques against samples from the set of data. After testing the candidate compression techniques against the samples, the resulting compression ratios are compared. The compression technique to use on the set of data is then selected based, in part, on the compression ratios achieved during the compression tests performed on the sample data.

18 Claims, 7 Drawing Sheets

Related U.S. Application Data continuation-in-part of application No. 12/617,669, filed on Nov. 12, 2009, now Pat. No. 8,935,223.

(60) Provisional application No. 61/174,447, filed on Apr. 30, 2009.

(56) References Cited

U.S. PATENT DOCUMENTS

| | | | |
|---|---|---|---|
| 5,404,510 A | 4/1995 | Smith et al. | |
| 5,506,979 A | 4/1996 | Menon | |
| 5,546,575 A | 8/1996 | Potter | |
| 5,699,457 A | 12/1997 | Adar et al. | |
| 5,794,229 A | 8/1998 | French et al. | |
| 5,867,723 A | 2/1999 | Chin et al. | |
| 5,995,080 A | 11/1999 | Biro | |
| 6,061,763 A | 5/2000 | Rubin et al. | |
| 6,216,125 B1 | 4/2001 | Johnson | |
| 6,334,123 B1 | 12/2001 | Ross et al. | |
| 6,643,633 B2 | 11/2003 | Chau et al. | |
| 6,959,300 B1 | 10/2005 | Caldwell et al. | |
| 7,031,994 B2 | 4/2006 | Lao et al. | |
| 7,076,108 B2 | 7/2006 | Huang et al. | |
| 7,079,056 B2 | 7/2006 | Weaver | |
| 7,225,249 B1 | 5/2007 | Barry et al. | |
| 7,469,266 B2 | 12/2008 | Gustavson et al. | |
| 7,496,589 B1 * | 2/2009 | Jain et al. | 707/999.101 |
| 7,552,130 B2 | 6/2009 | Cook et al. | |
| 7,552,218 B2 | 6/2009 | Kaluskar et al. | |
| 7,558,290 B1 | 7/2009 | Nucci et al. | |
| 7,565,346 B2 | 7/2009 | Fan et al. | |
| 7,693,325 B2 | 4/2010 | Pulla et al. | |
| 7,707,194 B2 | 4/2010 | Bresch et al. | |
| 7,720,878 B2 | 5/2010 | Caldwell et al. | |
| 7,882,122 B2 | 2/2011 | Wong | |
| 8,032,499 B2 | 10/2011 | Faerber et al. | |
| 8,073,777 B2 | 12/2011 | Barry et al. | |
| 8,099,440 B2 | 1/2012 | Johnson | |
| 8,203,972 B2 | 6/2012 | Sauermann | |
| 8,296,517 B2 | 10/2012 | Potapov | |
| 8,392,382 B2 | 3/2013 | Marwah et al. | |
| 8,583,692 B2 | 11/2013 | Ganesh et al. | |
| 8,645,337 B2 | 2/2014 | Kapoor et al. | |
| 8,806,062 B1 * | 8/2014 | Vertongen | H04L 29/08783 709/247 |
| 8,832,142 B2 | 9/2014 | Marwah et al. | |
| 2003/0108248 A1 | 6/2003 | Huang et al. | |
| 2003/0212694 A1 | 11/2003 | Potapov et al. | |
| 2004/0033803 A1 | 2/2004 | Varonen et al. | |
| 2004/0117396 A1 | 6/2004 | Avadhanam et al. | |
| 2004/0139099 A1 | 7/2004 | Weaver | |
| 2005/0027729 A1 | 2/2005 | Kuchinsky et al. | |
| 2005/0086267 A1 | 4/2005 | Avadhanam et al. | |
| 2005/0192941 A1 | 9/2005 | Biedenstein | |
| 2005/0210054 A1 * | 9/2005 | Harris | 707/101 |
| 2005/0216421 A1 | 9/2005 | Barry et al. | |
| 2005/0278324 A1 | 12/2005 | Fan et al. | |
| 2006/0074941 A1 | 4/2006 | Flynn | |
| 2006/0100912 A1 | 5/2006 | Kumar et al. | |
| 2006/0190425 A1 | 8/2006 | Chang | |
| 2007/0112736 A1 | 5/2007 | Okamoto et al. | |
| 2007/0143248 A1 | 6/2007 | Uppala | |
| 2008/0010240 A1 | 1/2008 | Zait | |
| 2008/0098048 A1 | 4/2008 | Cao et al. | |
| 2008/0294676 A1 | 11/2008 | Faerber et al. | |
| 2008/0294863 A1 | 11/2008 | Faerber et al. | |
| 2009/0006399 A1 | 1/2009 | Raman et al. | |
| 2009/0019029 A1 | 1/2009 | Tommaney | |
| 2009/0234823 A1 | 9/2009 | Wong | |
| 2009/0319536 A1 | 12/2009 | Parker et al. | |
| 2010/0030796 A1 | 2/2010 | Netz et al. | |
| 2010/0042587 A1 | 2/2010 | Johnson et al. | |
| 2010/0161567 A1 | 6/2010 | Makela | |
| 2010/0278446 A1 | 11/2010 | Ganesh et al. | |
| 2010/0281004 A1 | 11/2010 | Kapoor et al. | |
| 2011/0029569 A1 | 2/2011 | Ganesh et al. | |
| 2011/0047330 A1 | 2/2011 | Potapov | |
| 2011/0219020 A1 | 9/2011 | Oks et al. | |
| 2011/0295817 A1 | 12/2011 | Chandrasekar | |
| 2012/0054225 A1 | 3/2012 | Marwah et al. | |
| 2012/0117038 A1 | 5/2012 | Ganesh et al. | |
| 2012/0143833 A1 | 6/2012 | Ganesh et al. | |
| 2015/0032763 A1 | 1/2015 | Marwah et al. | |

OTHER PUBLICATIONS

U.S. Appl. No. 12/871,882, filed Aug. 30, 2010, Final Office Action, Nov. 2, 2012.

U.S. Appl. No. 12/871,824, filed Aug. 30, 2010, Final Office Action, Jan. 4, 2013.

U.S. Appl. No. 13/229,641, filed Sep. 9, 2011, Office Action, Nov. 26, 2012.

U.S. Appl. No. 12/791,337, filed Jun. 1, 2010, Advisory Action, Feb. 11, 2013.

U.S. Appl. No. 12/617,669, filed Nov. 12, 2009, Final Office Action, Sep. 25, 2012.

U.S. Appl. No. 13/371,354, filed Feb. 10, 2012, Office Action, Sep. 28, 2012.

U.S. Appl. No. 12/871,824, filed Aug. 30, 2010, Office Action, Jun. 26, 2012.

U.S. Appl. No. 12/871,882, filed Aug. 30, 2010, Office Action, Apr. 25, 2012.

U.S. Appl. No. 12/791,337, filed Jun. 1, 2010, Office Action, May 2, 2012.

U.S. Appl. No. 12/769,205, filed Apr. 25, 2010, Final Office Action, May 22, 2012.

U.S. Appl. No. 12/871,862, filed Aug. 30, 2010, Notice of Allowance, Feb. 29, 2012.

U.S. Appl. No. 12/871,862, filed Aug. 30, 2010, 2nd Notice of Allowance, Apr. 11, 2012.

U.S. Appl. No. 12/769,205, filed Apr. 28, 2010, Office Action, Dec. 6, 2011.

U.S. Appl. No. 12/617,669, filed Nov. 12, 2009, Restriction Requirement, Jan. 3, 2012.

U.S. Appl. No. 12/617,669, filed Nov. 12, 2009, Restriction Requirement, Sep. 20, 2011.

U.S. Appl. No. 12/791,337, filed Jun. 1, 2010, Examiners Answers, Dec. 26, 2014.

U.S. Appl. No. 12/871,824, filed Aug. 30, 2010, Notice of Allowance, Apr. 30, 2014.

U.S. Appl. No. 12/617,669, filed Nov. 12, 2009, Notice of Allowance, Mar. 13, 2014.

U.S. Appl. No. 12/871,882, filed Aug. 30, 2010, Notice of Allowance, Apr. 15, 2013.

U.S. Appl. No. 12/791,337, filed Jun. 1, 2010, Office Action, Jun. 28, 2013.

U.S. Appl. No. 12/769,205, filed Apr. 28, 2010, Notice of Allowance, Jul. 29, 2013.

U.S. Appl. No. 12/617,669, filed Nov. 12, 2009, Office Action, Sep. 19, 2013.

U.S. Appl. No. 14/480,009, filed Sep. 8, 2014, Interview Summary, Oct. 14, 2015.

U.S. Appl. No. 14/480,009, filed Sep. 8, 2014, Office Action, Jul. 2, 2015.

Ailamaki, Anastassia, et al., "Weaving Relations for Cache Performance," Proceedings of the 27th International Conference on Very Large Data Bases, Rome, Italy, Sep. 11-14, 2001, 14 pages.

Elmasri, et al., "Fundatmentals of Database Systems," Third Edition, Addison-Wesley Longman, Inc., Copyright © 2000, ISBN-0-8053-1755-4, pp. 32, 70, 118, 131-132, 134, 155-159, 170, 252-254, 558, 569-573, 591-592, and 789-790 (26 pgs).

U.S. Appl. No. 14/480,009, filed Sep. 8, 2014, Final Office Action, Jan. 25, 2016.

U.S. Appl. No. 14/480,009, filed Sep. 8, 2014, Office Action, Jun. 30, 2016.

* cited by examiner

TABLE 300

|     | A         | B       | C         |
| --- | --------- | ------- | --------- |
| R1  | IMAGE A1  | NAME1   | IMAGE C1  |
| R2  | IMAGE A2  | NAME2   | IMAGE C2  |
| R3  | IMAGE A3  | NAME3   | IMAGE C3  |
| R4  | IMAGE A4  | NAME4   | IMAGE C4  |
| R5  | IMAGE A5  | NAME4   | IMAGE C5  |
| R6  | IMAGE A6  | NAME6   | IMAGE C6  |
| R7  | IMAGE A7  | NAME7   | IMAGE C7  |
| R8  | IMAGE A8  | NAME8   | IMAGE C8  |
| R9  | IMAGE A9  | NAME9   | IMAGE C9  |
| R10 | IMAGE A10 | NAME10  | IMAGE C10 |

FIG. 3

COMPRESSION ANALYZER

BENEFIT CLAIM; CROSS-REFERENCE TO RELATED APPLICATIONS

This application claims benefit as a Continuation of application Ser. No. 12/769,508, filed Apr. 28, 2010, the entire contents of which is hereby incorporated by reference as if fully set forth herein, under 35 U.S.C. §120. The applicant(s) hereby rescind any disclaimer of claim scope in the parent application(s) or the prosecution history thereof and advise the USPTO that the claims in this application may be broader than any claim in the parent application(s).

Application Ser. No. 12/769,508 has priority to Provisional Application No. 61/174,447, filed Apr. 30, 2009, the entire contents of which are hereby incorporated by reference as if fully set forth herein.

Application Ser. No. 12/769,508 also has priority as a continuation-in-part of U.S. patent application Ser. No. 12/617,669, entitled STRUCTURE OF HIERARCHICAL COMPRESSED DATA STRUCTURE FOR TABULAR DATA, filed on Nov. 12, 2009, the entire contents of which are hereby incorporated by reference as if fully set forth herein.

This application is also related to U.S. patent application Ser. No. 12/769,205, entitled Archive Compression Of Tables, filed on same day herewith, the entire contents of which are hereby incorporated by reference as if fully set forth herein.

FIELD OF THE INVENTION

The present invention relates to tabular data and, more specifically, to automatically determining how to compress tabular data.

BACKGROUND

Computers are used to store and manage many types of data. Tabular data is one common form of data that computers are used to manage. Tabular data refers to any data that is logically organized into rows and columns. For example, word processing documents often include tables. The data that resides in such tables is tabular data. All data contained in any spreadsheet or spreadsheet-like structure is also tabular data. Further, all data stored in relational tables, or similar database structures, is tabular data.

Logically, tabular data resides in a table-like structure, such as a spreadsheet or relational table. However, the actual physical storage of the tabular data may take a variety of forms. For example, the tabular data from a spreadsheet may be stored within a spreadsheet file, which in turn is stored in a set of disk blocks managed by an operating system. As another example, tabular data that belongs to a relational database table may be stored in a set of disk blocks managed by a database server.

How tabular data is physically stored can have a significant effect on (1) how much storage space the tabular data consumes, and (2) how efficiently the tabular data can be accessed and manipulated. If physically stored in an inefficient manner, the tabular data may consume more storage space than desired, and result in slow retrieval, storage and/or update times.

Often, the physical storage of tabular data involves a trade-off between size and speed. For example, a spreadsheet file may be stored compressed or uncompressed. If compressed, the spreadsheet file will be smaller, but the entire file will typically have to be decompressed when retrieved, and re-compressed when stored again.

Some approaches have been developed for automatically selecting the compression techniques to use on a particular set of data. One such approach is described in U.S. Pat. No. 5,546,575, issued to Potter on Aug. 13, 1996. According the Potter approach, the data that is going to be stored in the column of a table is inspected to find patterns, such as characters that repeatedly occur together in the same positions within the column. Depending on the patterns found in the data, a compression technique is selected based on its ability to compress data that exhibits the detected type of pattern.

Unfortunately, the Potter approach may require a significant amount of additional programming every time a new compression technique is developed. To add the new compression technique to the set from which the automated selection is made, the selection process may have to be modified to detect patterns, in the input data, for which the selection process was not previously looking. Further, logic would have to be added to determine how to weigh the presence of the new pattern against the presence of other patterns, and then make an intelligent selection between the new compression technique and the other compression techniques, based on the weights.

Further, the best compression/performance balance may be particularly difficult to achieve using an automated selection process, because what is optimal may vary based on the needs of the user. For example, not knowing that a particular table will be used extensively, an automated selection process may choose to compress the table using a high-compression/high-overhead compression algorithm based on the fact that the table is going to store highly compressible data. Under these circumstances, the resulting overhead may be unacceptable to the user, regardless of the compression ratio achieved.

Because the user has information that may be important in the compression technique selection process, a data management system may simply put the compression technique selection process entirely in control of the user. While some sophisticated users may desire absolute control of the compression technique selection process, the vast majority of users would be overwhelmed by the number of compression options, and would lack the detailed understanding of the compression techniques that would be required to make an optimal choice.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

The present invention is illustrated by way of example, and not by way of limitation, in the figures of the accompanying drawings and in which like reference numerals refer to similar elements and in which:

FIG. 3 is a block diagram of a table;

DETAILED DESCRIPTION

Figure 1:
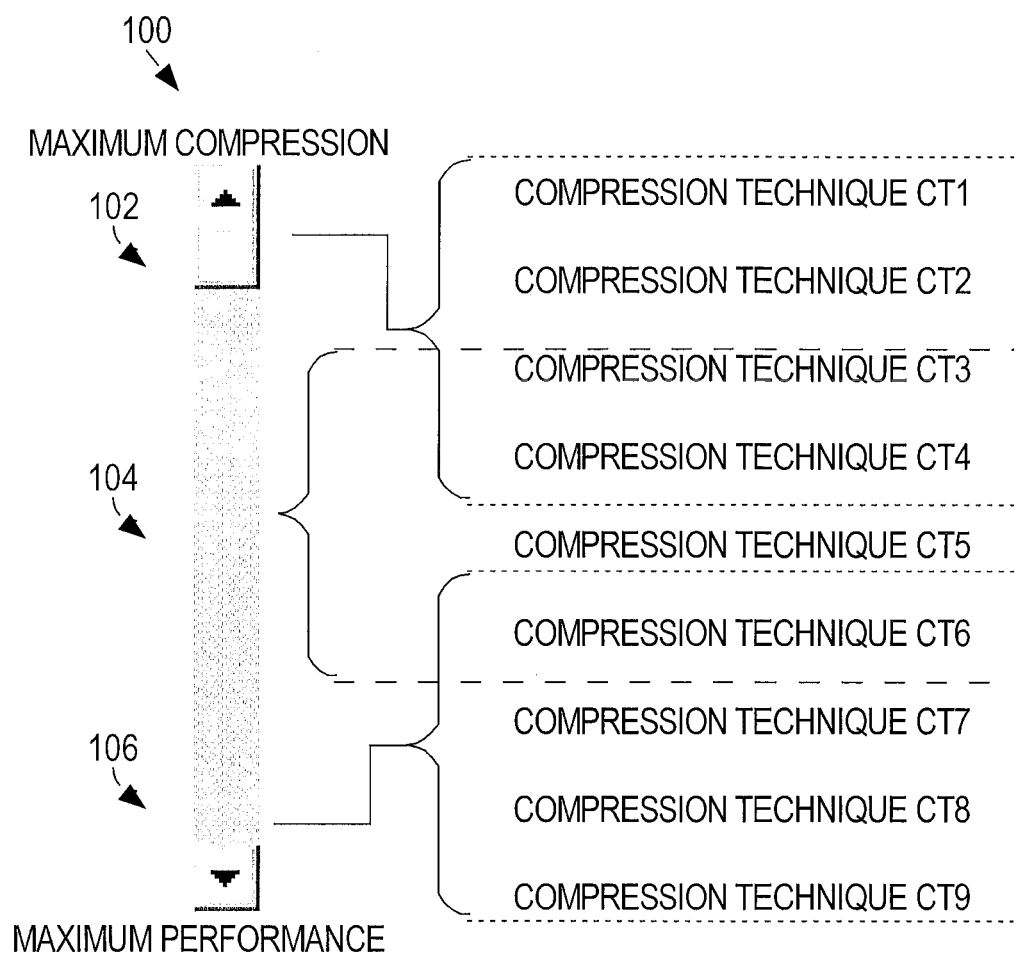
FIG. 1 is a block diagram illustrating how a user may select a balance point to indicate the relative importance of performance and compression for a particular set of data, according to an embodiment of the invention.

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

General Overview

Techniques are described herein for automatically selecting the compression techniques to be used on tabular data. The process or processes involved in the automated compression technique selection process are collectively referred to herein as the "compression analyzer". The compression analyzer may be implemented as software executing on one or more processors, may be hard-wired, or may include any combination of software and hard-wiring.

Each compression technique is assigned to a range of user specified balance points for compression ratio, performance characteristics, and computational costs.

According to one embodiment, the compression analyzer gives users high-level control over the selection process without requiring the user to know details about the specific compression techniques that are available to the compression analyzer. For example, in one embodiment, users are able to specify, for a given set of data, a "balance point" along the spectrum between "maximum performance" and "maximum compression". The point thus selected is used by the compression analyzer in a variety of ways. For example, in one embodiment, the compression analyzer uses the user-specified balance point to determine which of the available compression techniques qualify as "candidate techniques" for the given set of data.

Techniques are also provided for automatically selecting among the candidate compression techniques without having the selection logic of the compression analyzer know the implementation details of the compression techniques. Specifically, in one embodiment, the compression analyzer selects the compression technique to use on a set of data by actually testing the candidate compression techniques against samples from the set of data. After testing the candidate compression techniques against the samples, the resulting compression ratios and performance characteristics are compared. The compression technique to use on the set of data is then selected based, in part, on the compression ratios and performance characteristics achieved during the compression tests performed on the sample data.

Because the selection is based on the ratios achieved by actually applying the techniques to samples, and not on detecting patterns in the to-be-compressed data, newly developed compression techniques may be added to the pool from which a technique is selected without altering the logic of the compression analyzer itself. If a new compression technique is added to the candidate pool associated with the user-specified balance point, then the compression technique will be tested in the same manner as the techniques that were already in the pool. If the new technique produces the best results, then the new technique may be the technique that is selected by the compression analyzer to compress the data.

The resulting compression ratio may not be the only criteria. For example, in one embodiment, performance characteristics are also a criteria. All such criteria are evaluated for picking the compression algorithm.

According to one embodiment, the compression analyzer also considers combinations of compression techniques. Thus, one candidate compression technique may be CT1, while another may be CT2. Yet a third compression option may be to apply CT1, and then to apply CT2 to the compressed data produced by CT1.

Unfortunately, if all candidate techniques, and combinations thereof, are run against samples for all columns of a table, then the amount of overhead involved in the selection process may be unacceptable. Therefore, techniques are described herein for reducing the amount of compression techniques, and combinations thereof, to test as part of the selection process.

User-Specified Balance Points

As mentioned above, in one embodiment, users are able to specify, for a given set of data, a "balance point" along the spectrum between "maximum performance" and "maximum compression". The balance point thus selected is used by the system to determine which of the available compression techniques qualify as "candidate techniques" for the given set of data. The set of candidate techniques that correspond to a given balance point is referred to herein as the "candidate pool" for that balance point.

For example, selection of "maximum performance" may result in a candidate pool that includes one or more high-performance/low-compression techniques, but that excludes one or more high-compression/low-performance techniques. Conversely, selection of "maximum compression" may result in a candidate pool that includes one or more high-compression/low-performance techniques, but that excludes one or more high-performance/low-compression techniques.

Instead of selecting one of the extremes, the user may select a balance point that falls between the extremes. In response to user selection of a balance point that falls between the extremes, the candidate pool may include all compression techniques, or may exclude both the lowest-compression compression techniques and the lowest-performance compression techniques.

The balance points can also be specified based on natural language description of the intended pattern of data access.

FIG. 1 is a block diagram that illustrates the relationship between balance points and candidate pools, according to an embodiment of the invention. Referring to FIG. 1, a user is presented with a mechanism for specifying a balance point. In the illustrated embodiment, the mechanism includes a graphical user interface control 100 for selecting one of three balance points. While the graphical user interface control 100 illustrated in FIG. 1 is a slider, any type of control may be used, including radio buttons, a drop down menu, etc. Further, the selection mechanism need not involve a graphical user interface. For example, the selection may be specified in a CREATE TABLE statement used to create a relational table within a database system. As another example, the selection may be specified by a command-line prompt, or a user-set environment variable.

Further, while the embodiment illustrated in FIG. 1 allows the user to select among three balance points 102, 104 and 106, the actual number of balance points among which a user is able to choose may be any number equal to and greater than two.

For the purpose of explanation, it shall be assumed that the user-specified balance point is specified on a per-table basis. Thus, if the user specifies maximum compression, then the compression analyzer will attempt to select the compression techniques that give the highest compression for each of the columns. However, the user-specified balance point may alternatively specified on a per-column basis, where the user specifies maximum compression for one column, and minimal or no compression for another column.

User-specified balance points may also be specified on a per-load-operation basis. Thus, during one load operation, the user may specify that all of the to-be-loaded rows be compressed at maximum compression, and during a subsequent load operation into the same table, the user may specify that all of the to-be-loaded rows be compressed at minimum compression. As yet another alternative, the table may be statically partitioned based on some partitioning criteria, and the user-specified balance point may be specified on a per-static-table-partition basis.

In the embodiment illustrated in FIG. 1, balance point 102 corresponds to a candidate pool that includes compression techniques CT1 to CT4, but excludes CT5 to CT9. Balance point 104 corresponds to a candidate pool that includes compression techniques CT3 to CT6, and excludes compression techniques CT1 to CT2 and CT7 to CT9. Balance point 106 corresponds to a candidate pool that includes CT6-CT9, but that excludes CT1-CT5.

For the purpose of explanation, assume that control 100 is presented to the user to allow the user to specify preferences relative to a particular set of data (e.g. the data that will be loaded into a particular column of a table). Further assume that the user is interested in a relatively equal balance between performance and compression. Consequently, the user may manipulate control 100 to specify balance point 104. In response to user selection of balance point 104, the compression analyzer will consider only compression techniques CT3-CT6 when selecting a compression technique for that set of data.

Specifically, the compression analyzer obtains a sample from the set of data, and compresses the sample separately with each of compression techniques CT3 to CT6. In one embodiment, the technique that yields the best compression ratio and performance characteristics when applied to the sample data is selected as the compression technique to compress the set of data. In an alternative embodiment, the overhead cost associated with each of compression techniques CT3 to CT6 is also a factor in the selection, such that the compression technique with the best compression ratio may not ultimately be selected if its compression ratio is only slightly better than another compression technique that involves significantly less overhead. Further, if the compression ratios are not sufficient to justify the corresponding overhead, then the compression analyzer may simply determine to store the data uncompressed.

Compression may result in faster access of data compared to non-compressed (that is, the performance increase that results from the smaller size of compressed data may more than offset the compression overhead).For example, due to compression, more data can fit more in memory, and the benefits of fitting more data in memory may be far more than decompression overhead. In addition, reduction in I/O can offset the decompression overhead and hence overall access of data is faster compared to the non-compressed case.

In the embodiment illustrated in FIG. 1, compression techniques CT1 and CT2 would typically be the techniques that have the highest overhead costs. Thus, unless a user picks the balance point 102 associated with maximum compression, compression techniques CT1 and CT2 are not even considered in the selection process. Compression techniques CT3-CT6 have less overhead costs than CT1 and CT2, and therefore will be considered if the user picks balance point 104. At the other extreme, compression techniques CT7-CT9 have low overhead, but generally do not compress as well as the other techniques. Consequently, CT7-CT9 are only considered when the user picks the balance point 106 associated with maximum performance.

The distribution of compression techniques among candidate pools shown in FIG. 1 is merely one example of how the compression techniques may be spread among the candidate pools. In an alternative embodiment, the candidate pool associated with maximum compression includes all compression techniques, and as the user moves towards the performance end of the spectrum, the number of compression techniques in the candidate pools decreases.

Granularity of Balance Points

The level of granularity of the user-specified balance point may vary from implementation to implementation. For example, in one embodiment, the user specifies a balance point on a per-table basis. Thus, a table may have a single control, such as control 100, through which a user may a balance point. In such an embodiment, that single balance point applies when determining the candidate pools for all columns of the table.

In another embodiment, the user specifies a balance point on a per-column basis. In an embodiment that allows per-column balance points, the user may, for example, specify a maximum performance balance point (e.g. balance point 106) for a column that the user knows will be accessed frequently, and a maximum compression balance point (e.g. balance point 102) for a column that the user knows will be accessed rarely.

Balance points can also be specified at a superset (tablespace level) or at a subset level (partition or sub-partition level).

In yet another embodiment, the user may specify balance points on a column group basis. Specifically, a user may specify that values from three columns of a twenty-column table are to be compressed together, and then specify a single balance point for the column group that includes those three columns. The ability to specify column groups to compress together values from multiple columns shall be described in greater detail hereafter.

Multi-Layered Compression Techniques

In many cases, little benefit is gained by compressing data that has already been compressed. However, in some situations, applying successive layers of compression to the same set of data yields beneficial results. For example, applying compression technique CT9 before applying compression technique CT1 may double the compression ratio achieved by applying CT1 alone, with little additional overhead. Under these circumstances, it may be best for the compression analyzer to select the combination CT9-then-CT1, rather than any of the individual compression techniques.

According to one embodiment, the compression technique selection process takes two different approaches to multi-layer compression. According to one approach, a multi-layered compression sequence, such as CT9-then-CT1, is treated by the compression analyzer as if it were a single distinct compression technique. Thus, compression technique CT2 may actually represent performing CT9-then-CT1. A compression technique that represents the application of a sequence of compression techniques is referred to herein as a "multi-layered" compression technique.

The overhead associated with a multi-layered compression technique will typically differ from the overhead associated with the various compression techniques it represents. However, the overhead is not necessarily equal to the sum of the overheads of those compression techniques. For example, it is possible for CT9-then-CT1 to consume less overhead than CT1 itself, if CT9 is a low-overhead technique that transforms the data in a way that makes the data easier to compress using CT1.

In the example given above, a multi-layered compression technique represented the sequential application of two distinct compression techniques. However, a multi-layered compression technique may represent any number of compression techniques. There is no limit to the number of compression techniques that may be strung together to create a multi-layered compression technique.

Output Size

A variable output size algorithm is an algorithm that takes fixed or variable size input data and produces a variable size output. Such algorithms are harder to blockify as output size varies. In contrast, a fixed output size algorithm is an algorithm that takes as much input as required to produce a fixed size output. The fixed output size algorithms are simple to blockify.

Variable output sizes have the problem of space wastage. The granularity of work being a block, if a compressed output didn't fill the block completely, the remaining space in the block would be wasted. This wastage can become a sizable percentage of the total occupied space, particularly for larger sized blocks. This space wastage can be traded for CPU cost during compression by attempting a recompress hoping for a better fit into the output buffer.

More often than not, there is an upper bound on how large the output buffer can be. So even variable output sized algorithms may need recompression if the output they generate is larger than the upper bound. Statistical analysis can reduce the need of recompression by correctly estimating input size, but recompression cannot be eliminated completely.

Compression Sequence Testing

While multi-layered compression techniques treat a sequence of distinct compression techniques as if it were a single compression technique, compression sequence testing treats compression techniques as pieces of a multi-phase sequence. Specifically, when performing testing operations on samples, the compression analyzer not only finds out the compression ratios and performance characteristics produced by applying the individual compression techniques that belong to the candidate pool of the balance point selected by a user, but also finds out the compression ratios and performance characteristics produced by applying sequences of those compression techniques.

A more complex algorithm is applied only if compression gain is high enough to offset the extra cost.

For example, assume that a user has selected balance point 104. Without compression sequence testing, the automated compression analyzer would simply test each of CT3 to CT6 on the same sample of data, and select one of CT3 to CT6 based, at least in part, on the resulting compression ratios. However, with compression combination testing, the automated compression analyzer also tests permutations of CT3 to CT6, such as CT3-CT4, CT3-CT5, CT3-CT6, CT4-CT3, CT4-CT5, etc. In addition to two-member permutations, the automated compression analyzer may test combinations of three or more members, such as CT3-CT6-CT4.

Phase Groups

The sequence of candidate techniques that are tested by the compression analyzer for a given set of data are referred to herein as the "candidate sequences". If all permutations of the candidate techniques are considered as candidate sequences, then the number of candidate sequences is a factorial of the number of candidate compression techniques, which quickly becomes impractical. Therefore, according to one embodiment, the number of candidate sequences is reduced based on "phase groups".

Figure 2:
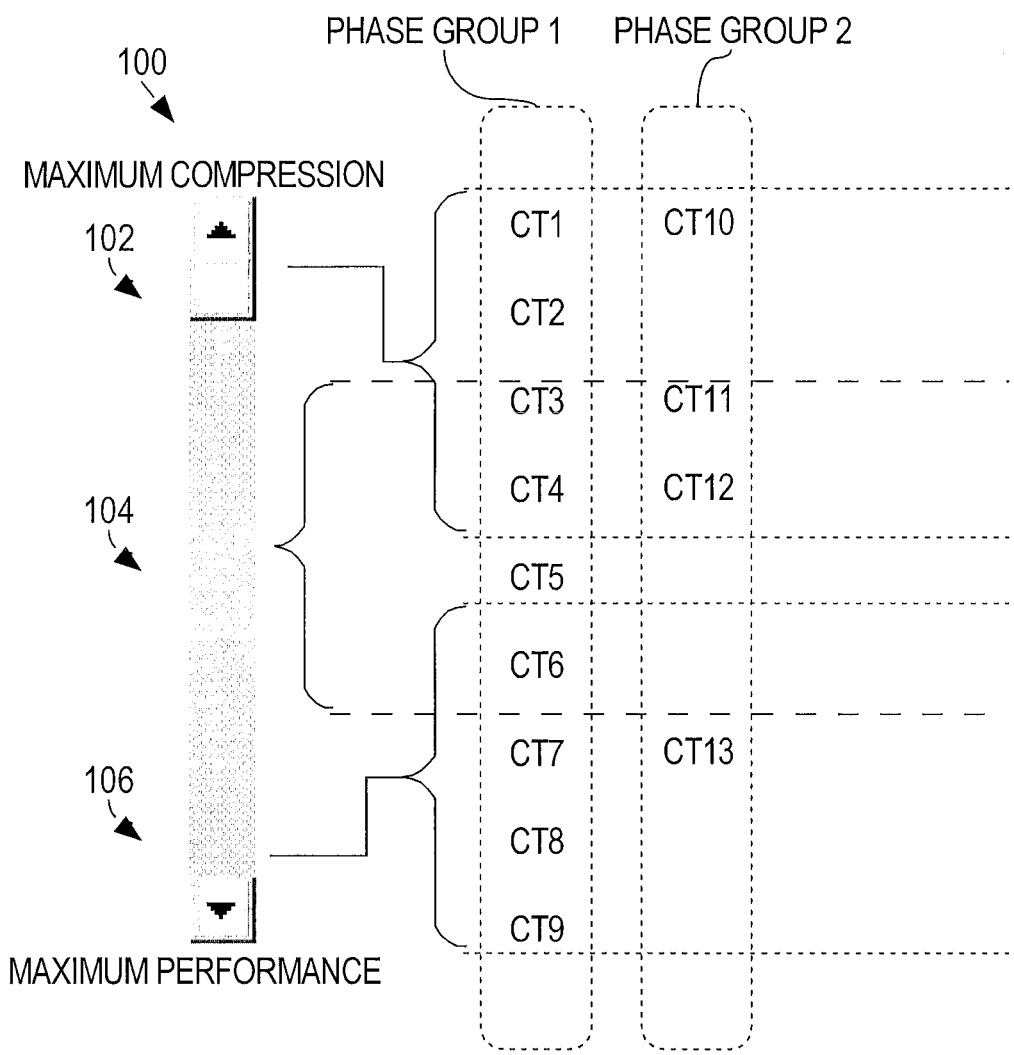
FIG. 2 is a block diagram illustrating how compression techniques may be divided into phase groups, where techniques from one phase group may be combined with techniques from other phase groups, according to an embodiment of the invention.

FIG. 2 illustrates an embodiment in which compression techniques CT1-CT9 belong to a phase group 1, and compression techniques CT10-CT14 belong to a phase group 2. While in this illustrated embodiment involves two phase groups, there may be more than two phase groups in other embodiments.

Dividing compression techniques into phase groups limits the number of permutations that the compression analyzer tests. For example, in one embodiment, the permutations of compression techniques that are tested by the compression analyzer do not include more than one compression technique from any given phase group. Thus, because CT1 and CT2 belong to the same phase group, CT1 would not be tested in any sequence that also includes CT2.

It may not make sense to apply the compression techniques in any order. However, in one embodiment, the phase groups themselves may be ordered. In such an embodiment, the candidate sequences tested by the compression analyzer may be limited to those sequences that correspond to the order of the phase groups. For example, assume that an order is established in which phase group 1 precedes phase group 2. Under these circumstances, the compression analyzer only tests compression technique sequences in which a member a phase group 1 precedes a member of phase group 2. For example, the compression analyzer would test the sequence CT1-CT10, but would not test the sequence CT10-CT1.

In an embodiment that uses ordered phase groups, assume that the user has selected balance point 102. Balance point 102 corresponds to the candidate pool that includes CT1-CT4 from the phase group 1, and CT10-CT13 from the phase group 2. Further, it is possible that the compression technique may not result in actually compression the data. Thus, in this example, phase group 1 includes four members, and phase group 2 includes four members. Consequently, the candidate sequences would include sixteen distinct compression sequences. The remaining 15 candidate sequences would be:

each of CT1 to CT4 individually,
each of CT10 to CT13 individually, and
the two-member permutations: CT1-CT10, CT1-CT11, CT1-CT12, CT1-CT13, CT2-CT10, CT2-CT11, CT2-CT12, CT2-CT13, CT3-CT10, CT3-CT11, CT3-CT12, CT3-CT13, CT4-CT10, CT4-CT11, CT4-CT12, and CT4-CT13.

In one embodiment, the phase groups roughly correspond to general types of compression techniques. For example, phase group 1 may include techniques that compress data at the column-value level, such as run length encoding, while phase group 2 includes more general compression algorithms, such as LZO. While FIG. 2 discloses an embodiment with two phase groups, the techniques described herein are not limited to any particular number of phase groups.

Column Groups

The granularity of the data upon which compression is performed may have significant ramifications, both with respect to performance and compression. For example, assume that a table has twenty columns. At the one extreme, it is possible to store and compress together data from all twenty columns. At the other extreme, it is also possible to store data for each of the twenty columns separately, and to compress data from each of the twenty columns independent of how data from the other nineteen columns has been compressed. Between the extremes, it is possible to group data from some columns together for the purpose of compression, while keeping other columns separate.

In another embodiment, all available metadata can be used to provide intelligent choices for column grouping.

A "column group" is a group of columns whose values are stored and compressed together. For example, assume that a table includes columns A, B and C. In an embodiment in which each column is its own column group, the data for columns A, B, and C would be stored separate from each other, and the compression analyzer would independently test data from columns A, B, and C to determine the compression sequence to use on each. The result of such independent testing may be, for example, that the sequence CT1-CT11 should be used on column A, CT3-CT10 should be used on column B, and CT13 alone should be used on column C.

Column groups are useful when the best compression ratios result from compressing at a granularity that is finer than all columns, but that is coarser than individual columns. For example, it may be that compressing data from columns A and C together yields significantly better compression ratios and performance characteristics than compressing columns A and C separately. Therefore, in one embodiment, the compression analyzer tests each of the candidate sequences on sample data from each of the permutations of columns.

For example, for a table with only three columns A, B and C, the compression analyzer would test each of the candidate sequences against data from column group ABC, against data from column group AB, against data from column group AC, against data from column group BC, and against data from columns A, B and C individually. Based on the compression ratios and performance characteristics produced by the tests, the compression analyzer may determine that the overall best compression is achieved by compressing column A with the compression sequence CT1-CT12, and by compressing column group BC with the sequence CT3-CT13.

Unfortunately, separately testing data from each possible column group quickly becomes impractical as the number of columns increases. Therefore, according to one embodiment, the column groups that are tested are limited based on certain criteria. For example, in one embodiment, only single-column column groups are tested. Thus, A, B, and C are tested individually against all candidate sequences, but multi-column column groups, such as AB, AB, BC and ABC are not tested.

In yet another embodiment, in addition to testing single-column column groups, the compression analyzer tests those multi-column groups that are identified by a user. For example, a user may know that columns A and C contain data that will compress well together. Under these circumstances, the user may specifically instruct the compression analyzer to test column group AC, in addition to testing each of the columns individually.

In another embodiment, the user may indicate the maximum number of columns to include in candidate column groups. For example, if the user specifies a maximum of 2, then column groups AB, AC and BC would be tested, but column groups ABC would not be tested.

In one embodiment, multi-column groups may be tested once for each possible column sequence. Thus, if columns ABC are to be tested as a column group, then the compression analyzer may separately test each permutation: ABC, ACB, BAC, BCA, CAB, and CBA.

Column Splitting

Some columns, such as a DATE column, may contain data that may be logically split into two or more parts. As another example, a column that contains email addresses may be split between user names (which appear before the @) and domain names (which appear after the @). Under these circumstances, it may be that different compression techniques would work better on the data of the different logical elements within the column. Thus, according to one embodiment, a user may specify how values within a column may be divided into parts. When a user has specified how to divide a column into parts in this manner, the compression analyzer may treat data for each of the parts as if it were data from distinct columns. Thus, the compression analyzer may perform compression tests against the user name values from the email column, and then separately perform compression tests against the domain name values from the email column.

As a result of the separate testing, the compression analyzer may ultimately conclude that the two portions of the email column should be stored separately, and that different compression sequences should be used on each.

Sort Order

The order in which values are arranged in a column may have a significant impact on how well the values compress. Therefore, in one embodiment, the candidate sequences are not simply run once against each column group that is being tested. Rather, the candidate sequences are run against each column group that is being tested for each of multiple row-orderings.

For example, assume that there are 25 candidate sequences to run against data from each of columns A, B and C. During the first round of testing, the 25 candidate sequences may be run on data from each of columns A, B and C without sorting the rows that contain the data that is being used for the tests. Because the rows are not sorted before testing, the rows will be compressed in the order in which the rows were received. This "received order" may or may not already be sorted, depending on the source of the rows.

After the first round of testing, the compression analyzer may sort the rows based on column A, and perform a second round of testing. Similarly, the rows may be sorted based on column B for a third round of testing. Finally, the rows may be sorted based on column C for a fourth round of testing. For each round of testing, the performance analyzer determines the best compression sequence for each of columns A, B, and C. The compression sequence that performs the best may change based on the sorting of the rows. For example, data from row A may compress best using CT1-CT10 during the first round of testing, but may compress best using CT2-CT10 during the second round of testing.

After the various rounds of testing, the compression analyzer compares the best compression results achieved in each round. For example, the best overall compression ratios achieved during rounds 1 through 4 may be respectively 1:2, 1:4, 1:12, 1:6. With these results, sorting the rows based on column B achieved a significantly better compression ratio than unsorted, or sorted based on other columns. Therefore, it is likely that the compression analyzer will determine that the rows should be sorted based on column B prior to compression.

Sort Column Candidates

In the example given above, the compression analyzer tested every compression sequence on every column both under unsorted conditions and after sorting on each possible column. Unfortunately, separately testing all possible sort options quickly becomes impractical as the number of columns increases. Therefore, according to one embodiment, if the number of columns that are being compress exceeds a threshold, the compression analyzer selects a subset of the columns as "sort column candidates". In such an embodiment, the compression analyzer performs one round of testing based on the unsorted rows, and one round for each of the sort column candidates. During the round for a sort column candidate, the rows are sorted based on values within the sort column candidate.

For example, assume that the compression analyzer is compressing data for a table with 20 columns, and that three columns X, Y and Z are selected as sort column candidates. During the first round, the compression analyzer tests each of the candidate sequences on data from each of the columns, without ordering the rows. The compression analyzer then repeats those same tests after sorting the rows based on the values from column X. The tests are repeated again after sorting the rows based on the values from column Y. Finally, the tests are repeated again after sorting the rows based on the values from column Z.

Sort Column Candidate Selection

Various techniques may be used by the compression analyzer for determining which columns to select as sort column candidates based on column entropy/compressibility. According to one embodiment, the compression analyzer selects sort column candidates based on the average size of their post-compression values achieved during the unsorted round of testing. The post-compression size of values in a column is an indication of whether better compression is likely. The larger the post-compression values in a column, the greater the likelihood that there are more absolute storage savings if sorted.

For example, the results of the first round of testing may indicate that, after compression, the average size of compressed values within column X is larger than the average size of compressed data within any other column. The average size of compressed values within column Y may be second largest, and the average size of compressed values within column Z may be the third largest. Based on these results, columns X, Y and Z may be selected as the three sort column candidates.

According to one embodiment, additional sort column candidates may be chosen if the results produced by the current set of sort column candidates exhibits a significant amount of deviation. For example, in one embodiment, the five columns with the highest average post-compression size are initially selected as sort column candidates. Then, separate testing rounds are performed for each of the five sort column candidates. If the overall compression ratios and performance characteristics achieved during the first five rounds exhibits little deviation, or if the compression ratios and performance characteristics are getting worse, then no additional sort column candidates are selected.

On the other hand, if the best compression ratios and performance characteristics produced during the various rounds of testing have widely varying ratios, and the compression ratios are not getting worse, then five more sort column candidates may be selected. In one embodiment, the same criteria are used to select the second five as was used to select the first five. Specifically, if the first five sort column candidates were selected based on average size of compressed values, then the second five sort column candidates may also be selected based on the fact that, of the remaining columns, they have the largest average size of compressed values.

Phase-Group Representatives

Even after (a) limiting the candidate set of compression techniques based on the user-selected balance-point, (b) limiting the candidate sequences based on phase groups, and (c) limiting the sort column candidates to a subset of the columns in the input data, the number of tests required to determine the optimal sort-order/compression-sequence for each column may incur an unacceptable amount of overhead. Therefore, according to one embodiment, the amount of testing is further reduced based on the use of phase-group representatives.

Specifically, in one embodiment, to pick the optimal compression technique from one phase group, the compression analyzer only tests the members of that phase group in combination with the phase-group representative of another phase group. For example, assume that the compression techniques are divided into the two phase groups illustrated in FIG. 2, and that the user has selected balance point 102. Under these circumstances, the candidate pool that includes CT1-CT4 from phase group 1, and CT10-CT13 from phase group 2. Further assume that CT12 is the phase-group representative of phase group 2. Under these circumstances, the compression analyzer would select a "best" compression technique from phase group 1 by testing each candidate compression technique of phase group 1 in combination with CT12 from phase-group 2.

Specifically, the compression analyzer would select one of CT1-CT4 by testing the sequences CT1-CT12, CT2-CT12, CT3-CT12 and CT4-CT12. Assuming that the compression sequence CT2-CT12 yielded the best compression ratio, CT2 would be selected as the "best" compression technique from group 1 for the particular data set to which the compression is being tested.

Having selected compression technique CT2 in this manner, compression analyzer then uses CT2 as the phase group representative of phase group 1 to select the "best" compression technique from phase group 2. Specifically, the compression analyzer tests the compression sequences CT2-CT10, CT2-CT11, CT2-CT12 and CT2-CT13. Assuming that the compression sequence CT2-CT13 yielded the best compression ratio, CT13 would be selected from phase group 2. Consequently, the compression sequence that would be selected for the data upon which the tests were performed would be CT2-CT13.

In situations where there a more than two levels of phase groups, the compression analyzer would continue to phase group 3, and so on.

Balance-Point Selection Effects

As mentioned above, the compression techniques that are considered during the testing process are based on the balance point selected by the user, according to an embodiment of the invention. The balance point selection may affect other things instead of, or in addition to, the compression techniques that are considered by the compression analyzer during testing.

For example, in one embodiment, the balance point also has an effect on the amount of sorting options the compression analyzer considers during the testing process. For example, if the user selects a balance point associated with maximum performance, the compression analyzer may not test any sorting options. Instead, the compression analyzer may simply perform all testing on the unsorted rows.

The compression analyzer may then increase the number of sorting options tested the closer the balance point is to the maximum compression extreme. For example, at an intermediate point, the compression analyzer may select five sort column candidates, while at the maximum compression the compression analyzer may select ten sort column candidates, or may even be configured to sort by all columns.

As another example, the balance point may determine whether the compression analyzer uses phase-group representatives. At the maximum performance balance point, the compression analyzer may use phase-group representatives to avoid testing all candidate sequences of compression techniques. On the other hand, at the maximum compression balance point, the compression analyzer may forego the use of phase-group representatives, and proceed to run separate tests for every candidate sequence.

The balance point may also determine the granularity at which the compression analyzer groups columns. For example, at the maximum performance balance point, the compression analyzer may only test columns individually. At the intermediate level, the compression analyzer may test columns both individually, and in two-column column groups. At maximum compression, the compression analyzer may test column groups at all possible levels of granularity. For example, for a five column table, the compression analyzer may test individual columns, all two-column permutations, all three-column permutations, all four-column permutations, and all five columns together.

Size is another criteria for balance point selection.

Using Compression Units

According to one embodiment of the invention, after compression analyzer has selected how to compress the columns and/or column groups of a table, metadata is stored to indicate sort order of the rows (if any), the grouping of the columns (if column-groups are used), the re-ordering of the columns (if the columns are reordered relative to the order specified in the table definition), and the mapping between (a) the columns and/or column groups and (b) the specific compression sequences that were selected by the compression analyzer. This metadata is then used to determine how to process data as the data is loaded into the table.

According to one embodiment, compression units are used as the containers for receiving and storing the data of a table that is compressed in this manner. Compression units are described in detail in U.S. patent application Ser. No. 12/617,669.

As an example of how compression units may be used to store data that is compressed based upon the selections made by the compression analyzer, assume that the tabular data for table 300, illustrated in FIG. 3, is to be stored into compression units. Further assume that the compression analyzer has determined, based on the user-selected balance point, that data for columns A and C should be compressed together using the sequence CT1-CT10, and that data for column B should be compressed using the sequence CT2-C11.

Figure 4:
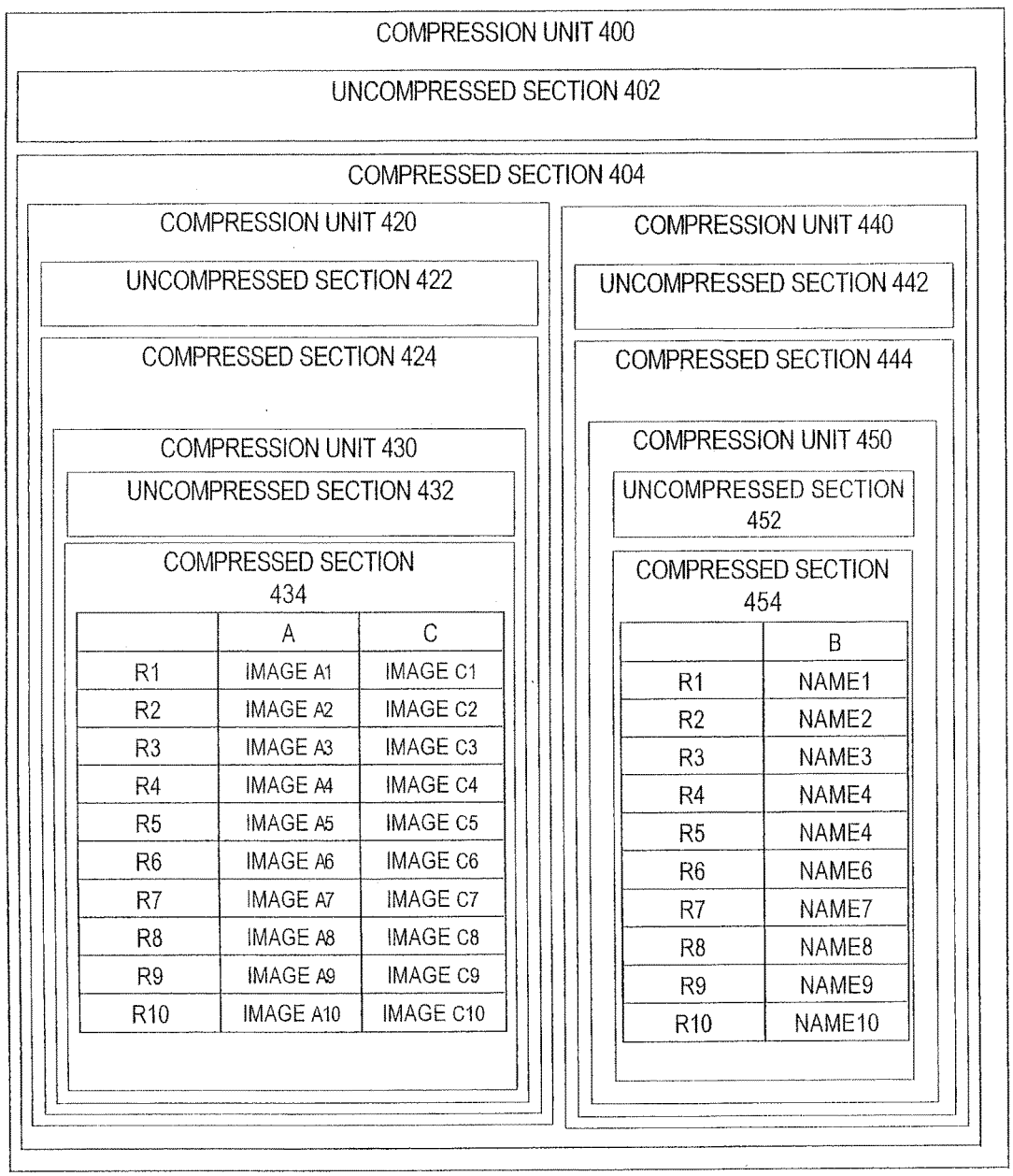
FIG. 4 is a block diagram illustrating one way data for table 300 may be organized within compression units, according to an embodiment of the invention.

Based on these decisions, the data for table T may be stored in three-levels of compression units, as illustrated in FIG. 4. Referring to FIG. 4, data for columns A and C are stored in the compressed section 434 of compression unit 430. Metadata in the uncompressed section 432 of compression unit 432 would indicate that the compressed section 434 is compressed using compression technique CT1. Compression unit 430 is contained inside the compressed section 424 of compression unit 420. Metadata in the uncompressed section 422 of compression unit 420 would indicate that the compressed section 424 is compressed using compression technique CT10.

Similarly, data for column B is in the compressed section 454 of compression unit 450. Metadata in the uncompressed section 452 of compression unit 450 would indicate that compressed section 454 is compressed using compression technique CT2. Compression unit 450 is contained inside the compressed section 444 of compression unit 440. Metadata in the uncompressed section 442 of compression unit 440 would indicate that the compressed section 444 is compressed using compression technique CT11.

Both compression unit 420 and compression unit 440 are in the compressed section 404 of compression unit 400. However, compressed section 404 is not actually compressed. Therefore, metadata in the uncompressed section 402 of compression unit 400 would indicate that compressed section 404 is uncompressed, that data within compressed section 404 is stored in column-major format, that compression unit 400 has two child compression units 420 and 440, and that data for columns A and C are stored in compression unit 420, while data for column B is stored in compression unit 440.

Figure 5:
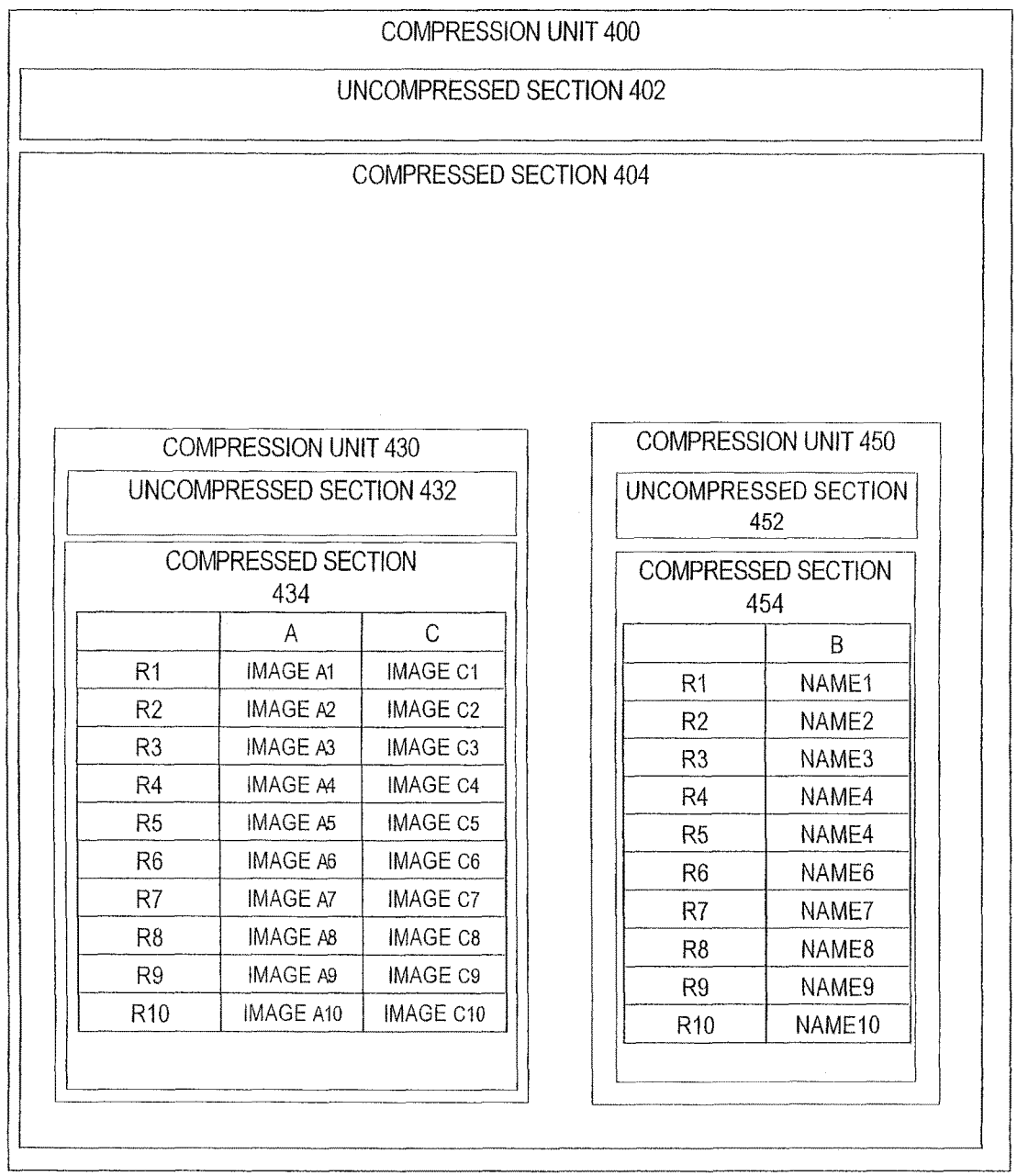
FIG. 5 is a block diagram illustrating another way data for table 300 may be organized within compression units, according to an embodiment of the invention.

FIG. 5 illustrates how data for table 300 may be stored if the same phase 2 compression technique is selected for all columns. For example, assume that the compression analyzer determined that columns A and C should be compressed together using the sequence CT1-CT10, and that data for column B should be compressed using the sequence CT2-CT10.

Referring to FIG. 5, compression units 430 and 450 are compressed as described above with reference to FIG. 4. However, because the phase 2 compression technique CT10 applies to all columns A, B and C, CT10 can be applied at the top-level compression unit 400. Consequently, compression units 420 and 440 are not needed. Specifically, compressed section 404 of compression unit 400 may be compressed using compression technique CT10, thereby applying CT10 to data from columns A and C (which has been compressed using CT1) and to data from column B (which has been compressed using CT2).

According to one embodiment, even when the same phase 2 compression technique applies to all data in a table, separate compression units are used to apply the compression technique. Thus, even when CT10 was selected as the phase 2 compression technique for all of columns A, B and C, compression units 420 and 440 may still be used to apply CT10 to compression units 430 and 450, respectively. One benefit of using different compression units to apply the same compression technique at the same level is to reduce the amount of data that needs to be decompressed in some situations.

For example, assume that a user submits a query to retrieve names from column B. If table 300 is stored as illustrated in FIG. 4, retrieving values from column B only involves decompressing compressed section 444 using CT10, and then decompressing compressed section 454 using CT1. In both cases, only the data from column B is being decompressed.

On the other hand, if table 300 is stored as illustrated in FIG. 5, then compressed section 404 is decompressed using CT10, then compressed section 454 is compressed using CT1. However, in this case, decompressing section 404 involves decompressing the data from all three columns A, B and C, instead of just the data from column B. In this case, the resources consumed in the decompression of data from columns A and C may be wasted, since the user was only interested in data from column B.

Making a New Compression Technique Available for Selection

The selection techniques described above, for selecting among a set of available compression techniques, do not require any particular compression techniques. Because the selection techniques are based on the actual compression ratios and performance characteristics achieved when the compression techniques are applied to samples of the to-be-compressed data, the selection techniques do not need to know the specifics of how the various compression techniques actually perform their compression. Consequently, newly-developed compression techniques may be added to the available set without modifying the logic of the compression analyzer. The techniques selected by the compression analyzer may include "standard" compression techniques, newly-developed compression techniques, or a mixture of both standard and new compression techniques.

For example, in one embodiment, the process of adding a compression technique to the available sets involves (a) identifying the code module that will perform the compression, (b) indicating the phase-group(s) to which the compression technique belongs, and (c) identifying the balance point(s) of the candidate pools that are to include the compression technique. For example, assume that CT11, shown in FIG. 2, has just been developed. To make CT11 available for selection by the compression analyzer, metadata is stored to (a) identify the code module for CT11, (b) indicate that CT11 is in phase-group 2, and (b) indicate that CT11 is to be in the candidate pools for both balance point 102 and balance point 104.

Example Data Loading Operation

Figure 6:
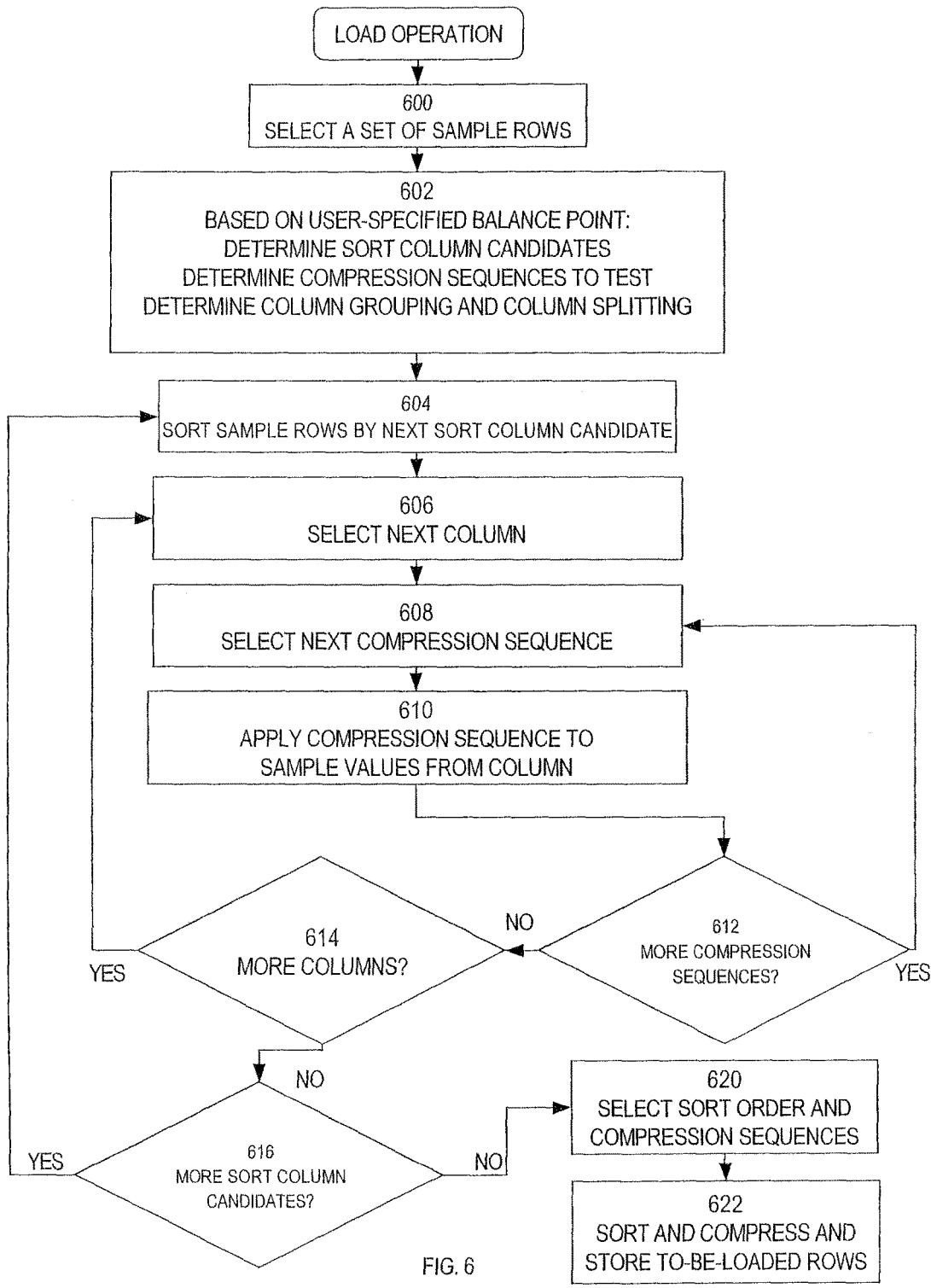
FIG. 6 is a flowchart illustrating steps for automatically determining how to compress tabular data, according to an embodiment of the invention.

Referring to FIG. 6, it is a flowchart illustrating steps performed during a load operation, according to an embodiment of the invention. For the purpose of explanation, assume that the load operation involves loading one million rows into table 300 illustrated in FIG. 3, and that table 300 has been created (e.g. by a CREATE TABLE command) but is currently unpopulated.

At step 600, a set of sample rows is selected from the to-be-loaded rows. The number of rows in the sample may vary from implementation to implementation. In general, the larger the sample, the more likely the sample will accurately represent the values with which table 300 will ultimately be populated (the "future contents" of table 300). The more accurately the sample represents the future contents, the better the compression ratios and performance characteristics produced by the set of sample rows will reflect the compression ratios and performance characteristics that will result when the future contents is compressed.

However, the larger the set of sample rows, the longer it takes to perform compression tests against the sample rows, and the greater the amount computational resources required and consumed by those tests. Therefore, while one embodiment may select all of the to-be-loaded rows as the sample, other embodiments may cap the number of rows selected as the sample. The cap may be based on a percentage of the to-be-loaded rows, based on a specific maximum number of samples, or may be dictated by the amount of resources, such as dynamic memory, that is available on the system on which the tests are to be performed.

At step 602, the compression analyzer selects the sort column candidates, the compression sequences to test, and the column grouping and column splitting combinations to be tested. In one embodiment, all of these determinations are based on the user-specified balance point. However, in other embodiments, some or all of these determinations may be based on other factors. For example, a user may specify that a certain column should be split, or that certain columns should be compressed together as a column group.

Steps 604 and 616 form a loop, where all steps within the loop are performed for each of the sort column candidates. Steps 606 and 614 form a loop, within the sort column loop, where all steps within the loop are performed for each column (or sub-column, or column group). Finally, steps 608 and 612 form a loop, within the column loop, where all steps within the loop are performed for each compression sequence. At step 610, the currently selected compression sequence is applied to values, in the sample rows, from the currently selected column. Since step 610 occurs within the sort column, the column, and the compression sequence loops, step 610 will cause a test to be run for each compression sequence, on values for each column, for each candidate sort order of the sample rows.

After compression tests have been run on the values within the sample rows for various combinations of sort orders and per-column compression sequences, at step 620 a sort order is selected for the table, and a compression sequence is selected for each column of the table. In selecting the sort order and compression sequences, the compression analyzer may take into account factors in addition to the compression ratios and performance characteristics produced by tests. For example, if the compression ratios produced by sorting the rows is only slightly better than the compression ratios produced without sorting, then the compression analyzer may choose to not sort prior to compression.

In one embodiment, statistics are maintained for various compression sequences, to track which compression sequences generally perform better in different situations. For example, the statistics may track, for each compression sequence, the characteristics of the columns against which the compression sequence was applied, and what compression ratios were produced. These historical statistics may be used by the compression analyzer to determine which compression sequences are generally better than others for columns that exhibit certain characteristics.

The compression analyzer may then make use of these statistics, along with the compression ratios and performance characteristics actually produced by the tests, when selecting a compression sequence for a particular column. For example, if a first compression sequence produces slightly better compression ratio for the particular column than a second compression sequence, the compression analyzer may still pick the second compression sequence if (a) the second compression sequence has significantly lower overhead and/or (b) based on the statistics, the second compression sequence is known to generally produce better results for columns that have the characteristics of the particular column. In situation (b), selecting the second compression sequence may be preferred because the better compression ratio produced by the first compression sequence may have simply been anomalous.

According to one embodiment, after the sort order and compression sequences are selected at step 620, a "map" that represents the selections is stored in a dictionary table. The map is stored with data that associates the map with the table (or with a particular partition of the table), so that a database server will be able to account for the compression during subsequent accesses to the table (or partition).

At step 622, once the sort order and compression sequences have been selected, the to-be-loaded rows are sorted, compressed, and stored. As mentioned above, the compressed data may be stored in structures designed to store compressed tabular data, such as the compression units described in U.S. patent application Ser. No. 12/617,669. When compression units are used to contain the compressed tabular data, the to-be-stored rows are processed in batches that are based on the size of the compression units. For example, if the compression units hold 8,000 rows, then 8000 to-be-loaded rows are obtained and sorted. Then, each column is compressed using the compression sequence that was automatically selected by the compression analyzer. This process is then repeated for each subsequent batch of 8000 to-be-loaded rows, where each batch populates one top-level compression unit.

In one embodiment, the determinations made during step 620 may be applied to the to-be-loaded rows for all subsequent load operations. Consequently, the overhead associated with determining the sort order and compression sequences is incurred only once, at the time of the initial load operation. Alternatively, the sort order and compression sequence selection process may be performed on a per-load or per-partition basis, where rows from one load or partition may be compressed differently than rows from other loads or partitions of the same table. While performing the compression technique selection process at each load and/or partition involves additional overhead, the resulting improvements in compression may be worth the overhead in situations where the nature of the tabular data varies significantly over time.

In one embodiment, statistics are used to determine whether to repeat the compression technique selection process prior to a load operation. For example, the compression analyzer may maintain statistics about the values that were used to make the prior compression technique selection (e.g. a particular column stored 10 unique values). If the variation between the statistics about the prior values and statistics from the current sample rows is less then a threshold, then the compression technique selection process is not repeated. Thus, the new rows are compressed using the compression sequences determined during a prior load operation. On the other hand, if the variation between the statistics about the prior values and statistics about the current sample rows exceeds the threshold (e.g. the same column now has thousands of unique values), then the compression technique selection process is repeated.

Standard Compression Techniques

As mentioned above, the selection techniques used by the compression analyzer to select compression sequences do not require the use of any particular compression technique. According to one embodiment, the compression techniques that are made available to the compression analyzer include substitution coders. Substitution coders are compression techniques that try to substitute text with a pointer to text already seen in the past.

LZ77 is an example of a substitution coder. LZ77 is a dictionary-based algorithm that achieves compression by replacing portions of data with references to matching data that has been previously seen. The matching portions (called matches henceforth) are encoded as a triple <l, d, c> where each of the next l characters is equal to the character d characters behind it in the uncompressed stream and c is the character following the match. The match can extend into the data being matched i.e. l>d is a valid condition. Thus, LZ77 uses an implicit in-place dictionary in the form of previously encoded data.

In LZ77, the encoder and decoder both keep track of some amount of the most recent data, which is the buffer size, and some typical sizes are 8 KB, 32 KB, or 256 KB. The encoder keeps this data to look for matches, and the decoder keeps this data to interpret the matches the encoder refers to. Therefore, encoder can use a smaller size sliding window than the decoder, but not vice-versa. Small size buffers result in lower probability of finding good matches while larger buffers need effective search algorithms to search the buffer for matches. Hence, the buffer size is a variable parameter which should be adjusted depending on whether higher compression ratio or faster compression speeds is the target. A pathological case for LZ77 is a pattern where data repeats with a period larger than the buffer size.

An LZ77 decoder uses scratch memory to write decoded data to ensure correct interpretation of future bytes. As the data being decompressed is dependent on successful decompression of data that came before, it is not possible to jump into the middle of a compression unit and interpret data. One must start from the beginning and decompress to the point of interest. The use of a triple to code a match is inefficient and many variations of LZ77 use leaner encoding patterns.

LZ78 is also a substitution coder. LZ78 is a variation of LZ77 algorithm. LZ78 uses the same technique of matching the data with data previously seen; but it uses an explicit dictionary and encodes matches by a pair <Index of the match in the dictionary i, next character c>. LZ78 adds the new entry formed by appending c to the match corresponding to entry i in the dictionary. The dictionary can grow indefinitely and hence in practice, it is pruned after it grows beyond a certain limit. Better compression ratios can generally be achieved by allowing the dictionary to grow to reasonable sizes Since the LZ78 dictionary is built on the fly, it is not possible to jump into the middle of a compression unit to interpret data. LZ78, like LZ77, uses scratch memory to keep the dictionary too.

LZO is another example of a substitution coder. LZO is a block-based compression that is focused on decompression speed. Decompression is simple and very fast. It requires no additional memory for decompression other than the source and destination buffers. LZO compresses a block of data into matches (a sliding dictionary) and runs of non-matching literals. LZO is not one algorithm but a set of algorithms.

LZW is an improved version of LZ78 and is used by UNIX Compress command. The compressor algorithm builds a string translation table from the text being compressed. The string translation table maps fixed-length codes (usually 12-bit) to strings. The string table is initialized with all single-character strings (256 entries in the case of 8-bit characters). As the compressor character-serially examines the text, it stores every unique two-character string into the table as a code/character concatenation, with the code mapping to the corresponding first character. As each two-character string is stored, the first character is outputted. Whenever a previously encountered string is read from the input, the longest such previously encountered string is determined, and then the code for this string concatenated with the extension character (the next character in the input) is stored in the table. The code for this longest previously encountered string is outputted and the extension character is used as the beginning of the next string. The decompression algorithm only requires the compressed text as an input, since it can build an identical string table from the compressed text as it is recreating the original text.

As with LZ78, queries decompress the data into a separate buffer, and decompression starts from the beginning of the compression unit.

LZMA uses an improved LZ77 compression algorithm, backed by a range coder (similar to Arithmetic coding). It uses a sliding dictionary up to 1 GB in length for duplicate string elimination. The LZ stage is followed by entropy coding using a Markov chain based range coder and Patricia trees.

According to one embodiment, substitution coding techniques are primarily assigned to phase-group 1, since they generally should be applied, if at all, before "standard" compression techniques that shall be described hereafter.

GZIP is one example of a standard compression technique. GZIP is based on an open standard, RFC 1951 called DEFLATE. It combines LZ77 with Huffman coding. Literals, lengths, and a symbol to indicate the end of the current block of data are all placed together into one alphabet. Distances can be safely placed into a separate alphabet, as since a distance only occurs just after a length, it cannot be mistaken for another kind of symbol or vice-versa. Gzip typically gives much better compression than LZ77.

As with LZ77, queries decompress the data into separate buffer, and decompression starts from the beginning of the compression unit.

BZ2, also known as Bzip2, compresses most files more effectively than more traditional gzip or ZIP but is slower. In most cases, LZMA and PPM algorithms in terms of absolute compression efficiency surpass bzip2. However according to the author, bzip2 gets within ten to fifteen percent of PPM, while being roughly twice as fast at compression and six times faster at decompression. Bzip2 uses the Burrows-Wheeler transform to convert frequently recurring character sequences into strings of identical letters, and then applies a move-to-front transform and finally Huffman coding. In bzip2, the blocks are generally all the same size in plaintext, which can be selected by a command-line argument between 100 kB-900 kB.

When a character string is transformed by the BWT, none of its characters change value. The transformation permutes the order of the characters. If the original string had several substrings that occurred often, then the transformed string will have several places where a single character is repeated multiple times in a row. This is useful for compression, since it tends to be easy to compress a string that has runs of repeated characters by techniques such as move-to-front transform and run-length encoding.

Prediction by Partial Matching (PPM) is an adaptive statistical data compression technique based on context modeling and prediction. PPM models use a set of previous symbols in the uncompressed symbol stream to predict the next symbol in the stream.

Predictions are usually reduced to symbol rankings. The number of previous symbols, n, determines the order of the PPM model which is denoted as PPM(n). If no prediction can be made based on all n context symbols a prediction is attempted with just n−1 symbols. This process is repeated until a match is found or no more symbols remain in context. At that point a fixed prediction is made. PPM/PAQ requires significant amount of RAM for compression and decompression.

7z is a compressed archive file format that supports several different data compression, encryption and pre-processing filters. The 7z format initially appeared as implemented by the 7-Zip archiver. The following compression methods are currently defined: LZMA, Bzip2, PPMD, and DEFLATE.

According to one embodiment, standard compression techniques are primarily assigned to phase-group 2, since they generally should be applied, if at all, after substitution coding techniques.

According to one embodiment, entropy encoding algorithms are also available for testing and selection by the compression analyzer. Huffman coding is an example of an entropy encoding algorithm. Specifically, the Huffman coding algorithm is a variable length entropy-encoding algorithm that uses prefix codes. Symbols that occur more frequently are coded using lesser number of bits, which results in compression. Typically, it is a two-pass method unless the number of occurrences of individual symbols is known in advance. In the first pass, the number of occurrences of each symbol is calculated. The second pass involves the actual encoding. The technique works by creating a binary tree of nodes where all leaf nodes are actual symbols placed at various levels of the tree according to their number of occurrences while the internal nodes represent the combined number of occurrences of all symbols in its sub tree. The tree creation works as follows:

Start with as many leaves as there are symbols.

Enqueue all leaf nodes into the first queue (by probability in increasing order so that the least likely item is in the head of the queue).

While there is more than one node in the queues:
  Dequeue the two nodes with the lowest weight.
    Create a new internal node, with the two just-removed nodes as children (either node can be either child) and the sum of their weights as the new weight.
    Enqueue the new node into the rear of the second queue.
    The remaining node is the root node; the tree has now been generated.

Every left child is assigned a bit '0' and right child is assigned bit '1' or vice versa. Thus every symbol gets assigned a string of 0s and 1s, which is the code for that symbol. Due to the way the tree is created, frequently occurring symbols end up at the higher levels and hence have shorter codes while symbols that occur infrequently have longer codes. Once this tree is generated, the second pass involves dumping the tree in the output stream and replacing every symbol by its code.

Since every symbol is represented using arbitrary number of bits, it is not possible to jump to the middle of the compressed stream and start decoding. To avoid this, the concept of "sync points" is used. In this technique, a 'stream break threshold' is used wherein the output stream is broken once the compressed stream size reaches the threshold or its size is such that adding another symbol's code would result in the output exceeding the threshold size. Essentially, blockification of compressed data stream happens; and hence while decompressing it is possible to jump to one of these sync points and decompress from there till the point of interest or beyond as the need maybe. Note that, sync points may result in some loss of compression ratio due to wastage of the last few bits for every sync point to sync point interval. But this loss is trivial compared to the benefits accrued due to random access.

According to one embodiment, a scheme that is based on fixed length codes with escape symbols is similar to fixed length codes except it only generates smaller fixed length codes for very frequently occurring symbols. E.g. for symbols that account for 90% of the symbols, a fixed length code can be generated. For rest of the symbols, another fixed level code can be generated that is bigger than most frequent symbols. One code from the top level is reserved for 'Not frequent symbol', and when this code is seen, the second symbol dictionary is searched.

An advantage of this approach is that it allows for faster decompression than Huffman. At the same time, it compression better than fixed length codes by having smaller codes for frequently occurring symbols.

Non-Standard Compression Techniques

Predicate evaluation can be run on Huffman encoded stream without actually decompressing the stream into symbols. For example, in one embodiment, a database server that is processing a query with a particular predicate can convert Right Hand side of a predicate to its Huffman code. If symbol is not found in the dictionary then, it does not appear in the encoding and the database server can stop the predicate evaluation. If the database server finds the code, then Huffman codes in the encoded stream can be compared against this code. This avoids a need to pollute L1 cache with symbols and improves decompression speeds.

According to one embodiment, the huffman encoding is optimized for decoding speeds by reducing the number of code length levels in the huffman tree.

Local Huffman (LHF) is defined as Huffman coding that uses a local dictionary i.e. the dictionary is stored for a smaller unit of data like a block or a compression unit. Local Huffman compresses well where the pattern of repetition changes at frequent intervals. If the probability of occurrence of symbols varies significantly over different portions of the input set, then local Huffman gives better compression by avoiding bloating of the dictionary. If the probability of occurrence of symbols of input data set is relatively uniform across the input, then local Huffman adds the overhead of storing the dictionary multiple times in every block.

Global Huffman (GHF) uses a dictionary at a global level. Global Huffman is typically useful where the cardinality of data is medium and the probability of occurrence of the symbols of input data set remains the same throughout the input. In such cases, global Huffman saves on dictionary space since it is stored only once. Data access maybe faster since the dictionary can be loaded only once. On the other hand, if the dictionary is large in size, it may not fit in memory and thus become costly to load. Under conditions mentioned above, dictionary size is small and hence lookup time better for global Huffman.

Instead of computing the Huffman codes right away, delta Huffman (DHF) computes a delta of the input set (usually difference between consecutive symbols OR difference between the symbol and a fixed threshold) and then computes the Huffman codes. Note that Huffman algorithm, by itself, is independent of the input data order since the compression achieved is independent of the positional characteristics. But for delta Huffman, the input order becomes important since the delta function output may depend on order. Delta Huffman performs better than normal Huffman when the number of symbols in data set fed to Huffman is reduced due to delta function. Also, typically, delta functions result in smaller values (assuming the input data is amenable to delta function), which results in a smaller dictionary size. Symbols in delta Huffman dictionary are also very skewed in probability with very few symbols occurring very frequently.

To make sure that a database server can seek in the buffer for decompression, DHF maintains starting symbol at every sync point, according to an embodiment of the invention.

Predicates cannot be directly evaluated on Delta Huffman codes. A database server that is processing a query that has a particular predicate needs to decode the code into its value and add it to pivot to get the actual value. Predicates can then be evaluated only on this value.

Adaptive Huffman is a one-pass algorithm. The first pass of computing the number of occurrences is eliminated and instead the Huffman tree is modified on the fly as the input is consumed. There are a number of implementations of this method like FGK (Faller-Gallagher-Knuth) and Vitter algorithm. This is useful in a real streaming environment where it is not possible to look at the data twice.

Arithmetic coding (also called Range coding) can be viewed as a generalization of Huffman coding. In practice, arithmetic coding is often preceded by Huffman coding, as it is easier to find an arithmetic code for a binary input than for a non-binary input.

Arithmetic coding encodes the entire message into a single number, a fraction n where ($0.0 \leq n < 1.0$). Compression algorithms that use arithmetic coding start by determining a model of the data—basically a prediction of what patterns will be found in the symbols of the message. The more accurate this prediction is, the closer to optimality the output will be. Each step of the encoding process, except for the very last, is the same; the encoder has basically just three pieces of data to consider:

The next symbol that needs to be encoded

The current interval (at the very start of the encoding process, the interval is set to [0,1), but that will change)

The probabilities the model assigns to each of the various symbols that are possible at this stage (higher-order or adaptive models mean that these probabilities are not necessarily the same in each step.)

The encoder divides the current interval into sub-intervals, each representing a fraction of the current interval proportional to the probability of that symbol in the current context. Whichever interval corresponds to the actual symbol that is next to be encoded becomes the interval used in the next step. When all symbols have been encoded, the resulting interval identifies, unambiguously, the sequence of symbols that produced it. Anyone who has the final interval and the model used can reconstruct the symbol sequence that must have entered the encoder to result in that final interval. It is not necessary to transmit the final interval, however; it is only necessary to transmit one fraction that lies within that interval. In particular, it is only necessary to transmit enough digits (in whatever base) of the fraction so that all fractions that begin with those digits fall into the final interval.

Decoding is done similar to encoding by starting with the interval [0,1), and using the same model. The symbol corresponding to the interval within which the fraction lies is the first symbol. The interval is then reduced correspondingly and all other intervals modified similar to the way it is done in encoding. The process continues till either an End-of-stream (EOS) marker is found or after the correct length (communicated by some other means) has been decoded.

Arithmetic coding (both encoding and decoding) is computationally expensive. Since only a single fraction is transmitted, the algorithm does not offer the ability to jump to any arbitrary offset and start decoding.

Other Compression Techniques

In addition to substitution coders, standard compression techniques, and entropy encoding techniques, the compression analyzer may also consider other types of transformation and/or compression techniques. For example, phage-group 1 may include Run Length Coding (RLC). Run-length coding is a very simple form of data compression in which runs of data (that is, sequences in which the same data value occurs in many consecutive data symbols) are stored as a single data value and count, rather than as the original run.

Run Length coding works well on a very controlled data set where the runs of data are large. LZ class algorithms can give the space benefits of RLC but at the cost of decompression. Both compression and decompression are cheap. Decompression is cheap since it simply involves scanning the tuples of <symbol, count>. It is possible to start from arbitrary positions and start decoding. It can give accurate estimates and can have either fixed or variable size output.

Other compression techniques that may be tested and selected by compression analyzer include Bitmap Run Length (BRL).

Native Compression Techniques for Dates and Integers

Dates and numbers have inherent structure that can be exploited to get compression. Dates are highly clustered data. In a typical table, one would see that century and year do not vary much at all. Similarly numbers in a column will vary in a range and that fact can be used to compress better.

According to one embodiment, when the to-be-compressed data is a set of integers, the compression analyzer also tests and may select an integer-specific compression technique. In integer-specific compression, for a given set of numbers that are being compressed, the encoder first finds the range of the numbers. Say (Min . . . Max). Min is stored in the beginning of the compression unit. All numbers in the data are delta from the Min and thus Min is the pivot that needs to be added to every decoded number.

```
NativeInteger
{
  ub4 number = value – Min;
  if (number < 128) {
    store as 1 byte number.
  }
  else if (number < (128*128)) {
    number = number | 0x8000;
    store as 2 byte number
  }
  else if (number < (128*128*128)) {
    number = number | 0xB00000;
    store as 3 byte number
  } else
  etc. etc..
  }
}
```

During decoding time, a decoder can look at first few bits to determine the length of the number and read corresponding number of bytes. The decoder needs to add Min to it to get the actual number.

Dates

In one implementation, a date is defined as a tuple with 7 bytes. (Century [CC], Year [YY], Month [MM], Date [DD], Hour [HH], Minute [MM], Seconds [SS]). Given a block with N dates, the encoder first finds the range for bytes in the tuple. E.g Century may have range of (20, 20) and minutes might have range of (0, 59). For all bytes with cardinality of 1, the encoder lists them in the beginning of the compression unit and does not repeat them in the data later. For the remaining entries, the encoder calculates a number representation of the date as follows.

```
NativeDate
{
  ub4 date = 0
  For every byte i for which cardinality is not 1
  {
    date = date*range[i] + value[i];
  }
  NativeInteger(date);
}
```

During decoding, every byte can be reconstructed by getting the remainder if divided by its range. After this, bytes with cardinality 1 can be added back to get the actual date value.

Fixed Length Codes

Given the number of symbols in the column, fixed length codes can be generated for all symbols. E.g. if number of unique symbols in a column are 22, then 5 bit fixed length code can be generated to store 22 symbols.

An advantage of fixed length codes is that it allows for fast decompression. However compression is sub-optimal when compared with Huffman or other encoders.

Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 7:
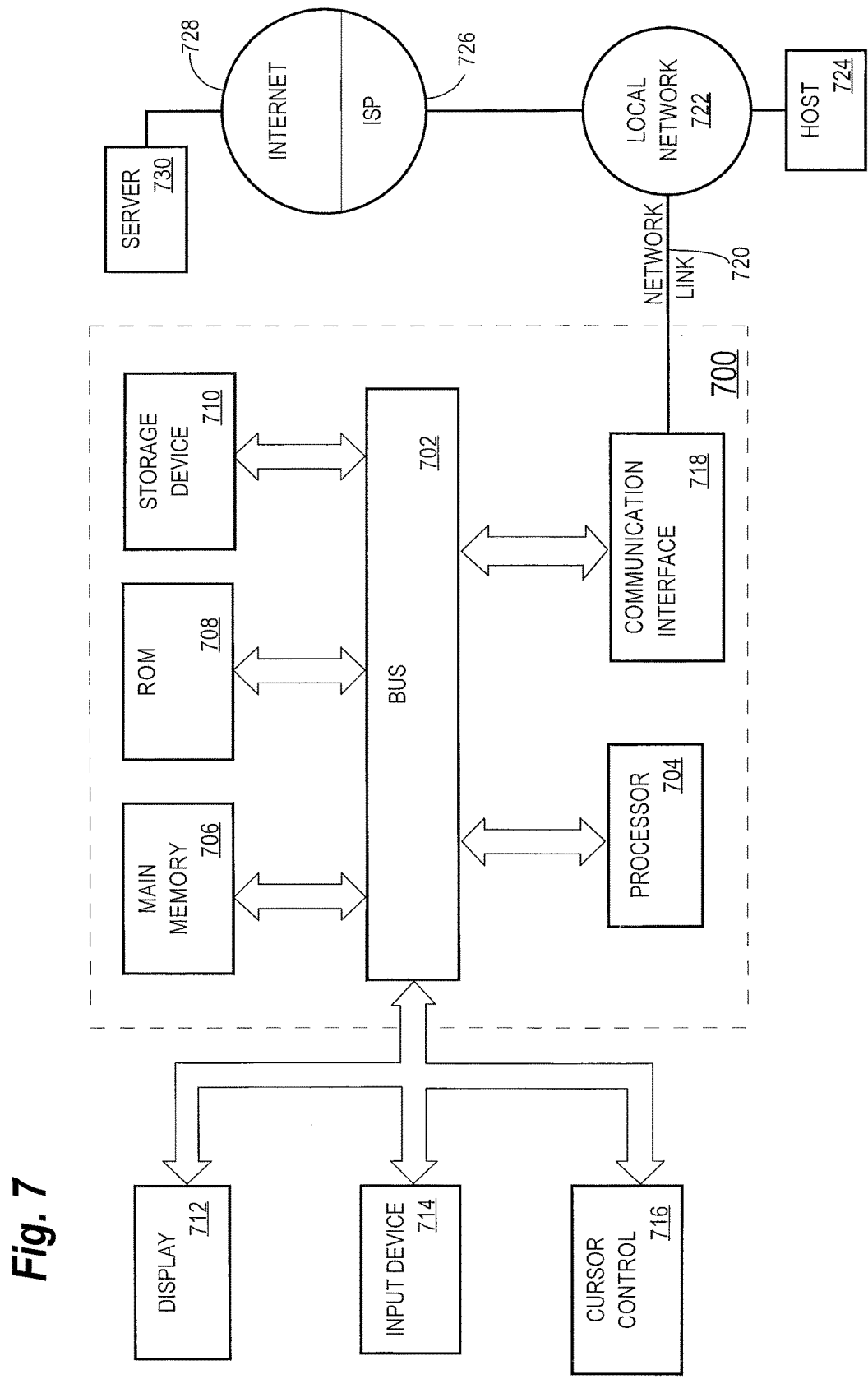
FIG. 7 is a block diagram of a computing device upon which embodiments of the invention may be implemented.

For example, FIG. 7 is a block diagram that illustrates a computer system 700 upon which an embodiment of the invention may be implemented. Computer system 700 includes a bus 702 or other communication mechanism for communicating information, and a hardware processor 704 coupled with bus 702 for processing information. Hardware processor 704 may be, for example, a general purpose microprocessor.

Computer system 700 also includes a main memory 706, such as a random access memory (RAM) or other dynamic storage device, coupled to bus 702 for storing information and instructions to be executed by processor 704. Main memory 706 also may be used for storing temporary variables or other intermediate information during execution of instructions to be executed by processor 704. Such instructions, when stored in storage media accessible to processor 704, render computer system 700 into a special-purpose machine that is customized to perform the operations specified in the instructions.

Computer system 700 further includes a read only memory (ROM) 708 or other static storage device coupled to bus 702 for storing static information and instructions for processor 704. A storage device 710, such as a magnetic disk or optical disk, is provided and coupled to bus 702 for storing information and instructions.

Computer system 700 may be coupled via bus 702 to a display 712, such as a cathode ray tube (CRT), for displaying information to a computer user. An input device 714, including alphanumeric and other keys, is coupled to bus 702 for communicating information and command selections to processor 704. Another type of user input device is cursor control 716, such as a mouse, a trackball, or cursor direction keys for communicating direction information and command selections to processor 704 and for controlling cursor movement on display 712. This input device typically has two degrees of freedom in two axes, a first axis (e.g., x) and a second axis (e.g., y), that allows the device to specify positions in a plane.

Computer system 700 may implement the techniques described herein using customized hard-wired logic, one or more ASICs or FPGAs, firmware and/or program logic which in combination with the computer system causes or programs computer system 700 to be a special-purpose machine. According to one embodiment, the techniques herein are performed by computer system 700 in response to processor 704 executing one or more sequences of one or more instructions contained in main memory 706. Such instructions may be read into main memory 706 from another storage medium, such as storage device 710. Execution of the sequences of instructions contained in main memory 706 causes processor 704 to perform the process steps described herein. In alternative embodiments, hard-wired circuitry may be used in place of or in combination with software instructions.

The term "storage media" as used herein refers to any media that store data and/or instructions that cause a machine to operation in a specific fashion. Such storage media may comprise non-volatile media and/or volatile media. Non-volatile media includes, for example, optical or magnetic disks, such as storage device 710. Volatile media includes dynamic memory, such as main memory 706. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 702. Transmission media can also take the form of acoustic or light waves, such as those generated during radio-wave and infra-red data communications.

Various forms of media may be involved in carrying one or more sequences of one or more instructions to processor 704 for execution. For example, the instructions may initially be carried on a magnetic disk or solid state drive of a remote computer. The remote computer can load the instructions into its dynamic memory and send the instructions over a telephone line using a modem. A modem local to computer system 700 can receive the data on the telephone line and use an infra-red transmitter to convert the data to an infra-red signal. An infra-red detector can receive the data carried in the infra-red signal and appropriate circuitry can place the data on bus 702. Bus 702 carries the data to main memory 706, from which processor 704 retrieves and executes the instructions. The instructions received by main memory 706 may optionally be stored on storage device 710 either before or after execution by processor 704.

Computer system 700 also includes a communication interface 718 coupled to bus 702. Communication interface 718 provides a two-way data communication coupling to a network link 720 that is connected to a local network 722. For example, communication interface 718 may be an integrated services digital network (ISDN) card, cable modem, satellite modem, or a modem to provide a data communication connection to a corresponding type of telephone line. As another example, communication interface 718 may be a local area network (LAN) card to provide a data communication connection to a compatible LAN. Wireless links may also be implemented. In any such implementation, communication interface 718 sends and receives electrical, electromagnetic or optical signals that carry digital data streams representing various types of information.

Network link 720 typically provides data communication through one or more networks to other data devices. For example, network link 720 may provide a connection through local network 722 to a host computer 724 or to data equipment operated by an Internet Service Provider (ISP) 726. ISP 726 in turn provides data communication services through the world wide packet data communication network now commonly referred to as the "Internet" 728. Local network 722 and Internet 728 both use electrical, electromagnetic or optical signals that carry digital data streams. The signals through the various networks and the signals on network link 720 and through communication interface 718, which carry the digital data to and from computer system 700, are example forms of transmission media.

Computer system 700 can send messages and receive data, including program code, through the network(s), network link 720 and communication interface 718. In the Internet example, a server 730 might transmit a requested code for an application program through Internet 728, ISP 726, local network 722 and communication interface 718.

The received code may be executed by processor 704 as it is received, and/or stored in storage device 710, or other non-volatile storage for later execution.

EXAMPLE EMBODIMENTS

Example embodiments X1-X40 include:

X1. A method comprising:
prior to storing a set of data in a table, performing the steps of:
performing a plurality of tests on a subset of data from the set of data to determine compression ratios produced by applying each of a plurality of compression techniques to the subset of data;
based, at least in part, on the compression ratios produced by each of the plurality of compression techniques, selecting a particular compression technique to apply to the set of data;
compressing the set of data using the particular compression technique to produce compressed data; and
storing the compressed data in the table;
wherein the method is performed by one or more computing devices.

X2. The method of X1 further comprising:
obtaining data that indicates a selected balance point;
wherein the selected balance point is one of a plurality of user-selectable balance points;
wherein the step of selecting a particular compression technique is based, at least in part, on the selected balance point.

X3. The method of X2 wherein the step of obtaining data includes receiving user input that selects the selected balance point.

X4. The method of X2 wherein:
each of the plurality of user-selectable balance points corresponds to a candidate pool of compression techniques; and
only those compression techniques that belong to the candidate pool of the selected balance point are tested during the plurality of tests.

X5. The method of X1 wherein:
performing a plurality of tests includes performing tests based on two or more phase groups;
performing the tests based on two or more phase groups includes:
applying a compression technique from a first phase group to the subset of data to produce first compressed results, and
applying a compression technique from a second phase group on the first compressed results to produce second compressed results.

X6. The method of X1 wherein performing a plurality of tests includes performing tests based on at least three phase groups.

X7. The method of X5, wherein performing a plurality of tests includes:
selecting a representative compression technique from a third phase group;
wherein said third phase group is one of said first phase group and said second phase group;
performing a first round of tests using said representative compression technique in combination with compression techniques from a fourth phase group;
wherein the fourth phase group is the other of said first phase group and said second phase group;
based, at least in part, on compression ratios produced during said first round of tests, selecting a particular compression technique from the fourth phase group;
performing a second round of tests using the particular compression technique in combination with compression techniques from the third phase group;
wherein the plurality of tests do not include any tests in which a member of the third phase group other than the representative compression technique is used in combination with any compression technique from the fourth phase group other than the particular compression technique.

X8. The method of X1 wherein:
the table has a plurality of columns;
the set of data includes a plurality of rows;
performing a plurality of tests includes performing a first test in which the plurality of rows are not sorted; and
performing a second test in which the plurality of rows are sorted based on a particular column of the plurality of columns.

X9. The method of X1 wherein:
the table has a plurality of columns;
the set of data includes a plurality of rows;
performing a plurality of tests includes
performing a first test in which the plurality of rows are sorted based on a first column of the plurality of columns, wherein the first test applies a particular sequence of one or more compression techniques to data for the first column of the plurality of columns; and
performing a second test in which the plurality of rows are sorted based on a second column of the plurality of columns, wherein the second test applies said particular sequence of one or more compression techniques to the data for the first column of the plurality of columns.

X10. The method of X9 further comprising selecting the first column as a sort column candidate based, at least in part, on compressed sizes of values from said first column.

X11. The method of X10 wherein the first column is selected as the sort column candidates based, at least in part, on compressibility of said first column.

X12. The method of X1 wherein:
the particular compression technique is a compression sequence that includes applying a first compression technique and then applying a second compression technique;
the step of storing the compressed data in the table is performed by storing the compressed data in one or more compression units; and the structure of the one or more compression units is based, at least in part, on the compression sequence.

X13. The method of X12 wherein:
the one or more compression units includes a first compression unit that has a first compressed section that is compressed using the first compression technique;
the one or more compression units includes a second compression unit that has a second compressed section that is compressed using the second compression technique; and
the first compression unit is contained in the second compressed section.

X14. The method of X2 further comprising determining how many sorting options to test based, at least in part, on the selected balance point.

X15. The method of X2 further comprising determining whether to use phase-group representatives during said testing based, at least in part, on the selected balance point.

X16. The method of X2 further comprising determining which column-groups to test based, at least in part, on the selected balance point.

X17. The method of X1 further comprising:
receiving user input that indicates a selected balance point;
wherein the selected balance point is one of a plurality of user-selectable balance points; and selecting a compression unit size based on the selected balance point.

X18. The method of X1 wherein:
the subset of data includes values from a particular column; and
performing a plurality of tests on a subset of data includes:
splitting the particular column by dividing individual values from the column into pieces; and testing one set of the pieces separately from another set of the pieces.

X19. The method of X1 further comprising:
storing statistics about compression ratios achieved by compression techniques on data that exhibits certain characteristics; and
selecting the particular compression technique based, at least in part, on said statistics and characteristics exhibited by said subset of data.

X20. The method of X1 wherein:
the set of data is data from a first load operation; and
the method further comprises:
storing statistics that indicate characteristics of said subset of data;
receiving a request for a subsequent load operation; and
determining whether to perform the plurality of tests for the subsequent load operation based, at least in part, on a comparison of the statistics to characteristics of data from the subsequent load operation.

X21. A computer-readable storage storing instructions which, when executed by one or more processors, cause:
prior to storing a set of data in a table, performing the steps of:
performing a plurality of tests on a subset of data from the set of data to determine compression ratios produced by applying each of a plurality of compression techniques to the subset of data;
based, at least in part, on the compression ratios produced by each of the plurality of compression techniques, selecting a particular compression technique to apply to the set of data;
compressing the set of data using the particular compression technique to produce compressed data; and
storing the compressed data in the table.

X22. The computer-readable storage of X21 further comprising instructions for:
obtaining data that indicates a selected balance point;
wherein the selected balance point is one of a plurality of user-selectable balance points;
wherein the step of selecting a particular compression technique is based, at least in part, on the selected balance point.

X23. The computer-readable storage of X22 wherein the step of obtaining data includes receiving user input that selects the selected balance point.

X24. The computer-readable storage of X22 wherein:
each of the plurality of user-selectable balance points corresponds to a candidate pool of compression techniques; and
only those compression techniques that belong to the candidate pool of the selected balance point are tested during the plurality of tests.

X25. The computer-readable storage of X21 wherein:
performing a plurality of tests includes performing tests based on two or more phase groups; performing the tests based on two or more phase groups includes:
applying a compression technique from a first phase group to the subset of data to produce first compressed results, and
applying a compression technique from a second phase group on the first compressed results to produce second compressed results.

X26. The computer-readable storage of X21 wherein performing a plurality of tests includes performing tests based on at least three phase groups.

X27. The computer-readable storage of X25, wherein performing a plurality of tests includes:
selecting a representative compression technique from a third phase group;
wherein said third phase group is one of said first phase group and said second phase group;
performing a first round of tests using said representative compression technique in combination with compression techniques from a fourth phase group;
wherein the fourth phase group is the other of said first phase group and said second phase group;
based, at least in part, on compression ratios produced during said first round of tests, selecting a particular compression technique from the fourth phase group;
performing a second round of tests using the particular compression technique in combination with compression techniques from the third phase group;
wherein the plurality of tests do not include any tests in which a member of the third phase group other than the representative compression technique is used in combination with any compression technique from the fourth phase group other than the particular compression technique.

X28. The computer-readable storage of X21 wherein:
the table has a plurality of columns;
the set of data includes a plurality of rows;
performing a plurality of tests includes
performing a first test in which the plurality of rows are not sorted; and
performing a second test in which the plurality of rows are sorted based on a particular column of the plurality of columns.

X29. The computer-readable storage of X21 wherein:
the table has a plurality of columns;
the set of data includes a plurality of rows;
performing a plurality of tests includes
performing a first test in which the plurality of rows are sorted based on a first column of the plurality of columns, wherein the first test applies a particular sequence of one or more compression techniques to data for the first column of the plurality of columns; and
performing a second test in which the plurality of rows are sorted based on a second column of the plurality of columns, wherein the second test applies said particular sequence of one or more compression techniques to the data for the first column of the plurality of columns.

X30. The computer-readable storage of X29 further comprising instructions for selecting the first column as a sort column candidate based, at least in part, on compressed sizes of values from said first column.

X31. The computer-readable storage of X30 wherein the first column is selected as the sort column candidates based, at least in part, on compressibility of said first column.

X32. The computer-readable storage of X21 wherein:
the particular compression technique is a compression sequence that includes applying a first compression technique and then applying a second compression technique;
the step of storing the compressed data in the table is performed by storing the compressed data in one or more compression units; and
the structure of the one or more compression units is based, at least in part, on the compression sequence.

X33. The computer-readable storage of X32 wherein:
the one or more compression units includes a first compression unit that has a first compressed section that is compressed using the first compression technique;
the one or more compression units includes a second compression unit that has a second compressed section that is compressed using the second compression technique; and
the first compression unit is contained in the second compressed section.

X34. The computer-readable storage of X22 further comprising instructions for determining how many sorting options to test based, at least in part, on the selected balance point.

X35. The computer-readable storage of X22 further comprising instructions for determining whether to use phase-group representatives during said testing based, at least in part, on the selected balance point.

X36. The computer-readable storage of X22 further comprising instructions for determining which column-groups to test based, at least in part, on the selected balance point.

X37. The computer-readable storage of X21 further comprising instructions for:
receiving user input that indicates a selected balance point;
wherein the selected balance point is one of a plurality of user-selectable balance points; and
selecting a compression unit size based on the selected balance point.

X38. The computer-readable storage of X21 wherein:
the subset of data includes values from a particular column; and
performing a plurality of tests on a subset of data includes:
splitting the particular column by dividing individual values from the column into pieces; and
testing one set of the pieces separately from another set of the pieces.

X39. The computer-readable storage of X21 further comprising instructions for:
storing statistics about compression ratios achieved by compression techniques on data that exhibits certain characteristics; and
selecting the particular compression technique based, at least in part, on said statistics and characteristics exhibited by said subset of data.

X40. The computer-readable storage of X21 wherein:
the set of data is data from a first load operation; and
the computer-readable storage further comprises:
storing statistics that indicate characteristics of said subset of data;
receiving a request for a subsequent load operation; and
determining whether to perform the plurality of tests for the subsequent load operation based, at least in part, on a comparison of the statistics to characteristics of data from the subsequent load operation.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A method comprising:
prior to storing a set of data in a table, performing the steps of:
obtaining data that indicates a selected balance point along a spectrum between maximum performance and maximum compression;
wherein the selected balance point is one of a plurality of user-selectable balance points along the spectrum between maximum performance and maximum compression;
wherein the plurality of user-selectable balance points include at least one balance point that corresponds to neither maximum performance nor maximum compression;
performing a plurality of tests on a subset of data from the set of data to determine compression ratios produced by applying each of a plurality of compression techniques to the subset of data;
wherein the table has a plurality of columns;
wherein the set of data includes a plurality of rows;
wherein, in a first test of the plurality of tests, the plurality of rows are not sorted;
wherein, in a second test of the plurality of tests, the plurality of rows are sorted based on a particular column of the plurality of columns;
selecting a particular compression technique to apply to the set of data based, at least in part, on:
the compression ratios produced by each of the plurality of compression techniques; and
the selected balance point;
compressing the set of data using the particular compression technique to produce compressed data; and
storing the compressed data in the table;
wherein the method is performed by one or more computing devices.

2. The method of claim 1 wherein the step of obtaining data includes receiving user input that selects the selected balance point.

3. The method of claim 1 further comprising determining how many sorting options to test based, at least in part, on the selected balance point, wherein each sorting option of the sorting options specifies a column to sort the set of data in the table before performing the plurality of tests.

4. The method of claim 1 further comprising:
determining to use phase-group representatives during said testing based, at least in part, on the selected balance point;
during said testing, applying a first compression technique specified in a first phase group as being representative of the first phase group; and
during said testing, applying a second compression technique specified in a second phase group as being representative of the second phase group.

5. The method of claim 1 further comprising determining which column-groups to test based, at least in part, on the selected balance point.

6. The method of claim 1,
wherein performing the plurality of tests includes:
performing the first test in which the plurality of rows are ordered according to a first ordering; and
performing the second test in which the plurality of rows are ordered according to a second ordering that is different than the first ordering.

7. The method of claim 1,
wherein performing a plurality of tests includes performing tests based on two or more phase groups;
wherein performing the tests based on two or more phase groups includes:
applying a first compression technique from a first phase group to the subset of data to produce first compressed results, and
applying a second compression technique from a second phase group on the first compressed results to produce second compressed results;
wherein the first compression technique is different than the second compression technique.

8. A method comprising:
prior to storing a set of data in a table, performing the steps of:
obtaining data that indicates a selected balance point along a spectrum between maximum performance and maximum compression;
wherein the selected balance point is one of a plurality of user-selectable balance points along the spectrum between maximum performance and maximum compression;
wherein the plurality of user-selectable balance points include at least one balance point that corresponds to neither maximum performance nor maximum compression;
wherein each of the plurality of user-selectable balance points corresponds to a candidate pool of compression techniques;
performing a plurality of tests on a subset of data from the set of data to determine compression ratios produced by applying each of a plurality of compression techniques to the subset of data;
wherein only those compression techniques that belong to the candidate pool of the selected balance point are tested during the plurality of tests;
selecting a particular compression technique to apply to the set of data based, at least in part, on:
the compression ratios produced by each of the plurality of compression techniques; and
the selected balance point;
compressing the set of data using the particular compression technique to produce compressed data; and
storing the compressed data in the table;
wherein the method is performed by one or more computing devices.

9. A method comprising:
prior to storing a set of data in a table, performing the steps of:
obtaining data that indicates a selected balance point along a spectrum between maximum performance and maximum compression;
wherein the selected balance point is one of a plurality of user-selectable balance points along the spectrum between maximum performance and maximum compression;
wherein the plurality of user-selectable balance points include at least one balance point that corresponds to neither maximum performance nor maximum compression;
performing a plurality of tests on a subset of data from the set of data to determine compression ratios produced by applying each of a plurality of compression techniques to the subset of data;
selecting a particular compression technique to apply to the set of data based, at least in part, on:
the compression ratios produced by each of the plurality of compression techniques; and
the selected balance point;
compressing the set of data using the particular compression technique to produce compressed data; and
storing the compressed data in the table;
wherein the method is performed by one or more computing devices;
wherein the table has a plurality of columns;
wherein the set of data includes a plurality of rows;
wherein, in a first test of the plurality of tests, the plurality of rows are sorted based on a first column of the plurality of columns, wherein the first test applies a particular sequence of one or more compression techniques to data for the first column of the plurality of columns; and
wherein, in a second test of the plurality of tests, the plurality of rows are sorted based on a second column of the plurality of columns, wherein the second test applies said particular sequence of one or more compression techniques to the data for the first column of the plurality of columns.

10. A non-transitory computer-readable storage storing instructions which, when executed by one or more processors, cause:
prior to storing a set of data in a table, performing the steps of:
obtaining data that indicates a selected balance point along a spectrum between maximum performance and maximum compression;
wherein the selected balance point is one of a plurality of user-selectable balance points along the spectrum between maximum performance and maximum compression;
wherein the plurality of user-selectable balance points include at least one balance point that corresponds to neither maximum performance nor maximum compression;

performing a plurality of tests on a subset of data from the set of data to determine compression ratios produced by applying each of a plurality of compression techniques to the subset of data;
wherein the table has a plurality of columns;
wherein the set of data includes a plurality of rows;
wherein, in a first test of the plurality of tests, the plurality of rows are not sorted;
wherein, in a second test of the plurality of tests, the plurality of rows are sorted based on a particular column of the plurality of columns;
selecting a particular compression technique to apply to the set of data based, at least in part, on:
the compression ratios produced by each of the plurality of compression techniques; and
the selected balance point;
compressing the set of data using the particular compression technique to produce compressed data; and
storing the compressed data in the table.

11. The non-transitory computer-readable storage of claim 10 wherein the step of obtaining data includes receiving user input that selects the selected balance point.

12. The non-transitory computer-readable storage of claim 10 wherein:
each of the plurality of user-selectable balance points corresponds to a candidate pool of compression techniques; and
only those compression techniques that belong to the candidate pool of the selected balance point are tested during the plurality of tests.

13. The non-transitory computer-readable storage of claim 10 further comprising instructions for determining how many sorting options to test based, at least in part, on the selected balance point, wherein each sorting option of the sorting options specifies a column to sort the set of data in the table before performing the plurality of tests.

14. The non-transitory computer-readable storage of claim 10 further comprising instructions for:
determining to use phase-group representatives during said testing based, at least in part, on the selected balance point;
during said testing, applying a first compression technique specified in a first phase group as being representative of the first phase group; and
during said testing, applying a second compression technique specified in a second phase group as bring representative of the second phase group.

15. The non-transitory computer-readable storage of claim 10 further comprising instructions for determining which column-groups to test based, at least in part, on the selected balance point.

16. The non-transitory computer-readable storage of claim 10,
wherein performing the plurality of tests includes:
performing the first test in which the plurality of rows are ordered according to a first ordering; and
performing the second test in which the plurality of rows are ordered according to a second ordering that is different than the first ordering.

17. The non-transitory computer-readable storage of claim 10,
wherein performing a plurality of tests includes performing tests based on two or more phase groups;
wherein performing the tests based on two or more phase groups includes:
applying a first compression technique from a first phase group to the subset of data to produce first compressed results, and
applying a second compression technique from a second phase group on the first compressed results to produce second compressed results;
wherein the first compression technique is different than the second compression technique.

18. A non-transitory computer-readable storage storing instructions which, when executed by one or more processors, cause:
prior to storing a set of data in a table, performing the steps of:
obtaining data that indicates a selected balance point along a spectrum between maximum performance and maximum compression;
wherein the selected balance point is one of a plurality of user-selectable balance points along the spectrum between maximum performance and maximum compression;
wherein the plurality of user-selectable balance points include at least one balance point that corresponds to neither maximum performance nor maximum compression;
performing a plurality of tests on a subset of data from the set of data to determine compression ratios produced by applying each of a plurality of compression techniques to the subset of data;
selecting a particular compression technique to apply to the set of data based, at least in part, on:
the compression ratios produced by each of the plurality of compression techniques; and
the selected balance point;
compressing the set of data using the particular compression technique to produce compressed data; and
storing the compressed data in the table;
wherein the table has a plurality of columns;
wherein the set of data includes a plurality of rows;
wherein, in a first test of the plurality of tests, the plurality of rows are sorted based on a first column of the plurality of columns, wherein the first test applies a particular sequence of one or more compression techniques to data for the first column of the plurality of columns; and
wherein, in a second test of the plurality of tests, the plurality of rows are sorted based on a second column of the plurality of columns, wherein the second test applies said particular sequence of one or more compression techniques to the data for the first column of the plurality of columns.

* * * * *

UNITED STATES PATENT AND TRADEMARK OFFICE
CERTIFICATE OF CORRECTION

PATENT NO. : 9,559,720 B2  
APPLICATION NO. : 13/631575  
DATED : January 31, 2017  
INVENTOR(S) : Marwah et al.

Page 1 of 1

It is certified that error appears in the above-identified patent and that said Letters Patent is hereby corrected as shown below:

On the Title Page

On page 2, Column 2, item (56), under Other Publications, Line 52, delete ""Fundatmentals" and insert -- "Fundamentals --, therefor.

In the Drawings

On sheet 4 of 7, in FIG. 4, under Reference Numeral 454, Line 6, for "R5" entry, delete "NAME4" and insert -- NAME5 --, therefor.

On sheet 5 of 7, in FIG. 5, under Reference Numeral 454, Line 6, for "R5" entry, delete "NAME4" and insert -- NAME5 --, therefor.

In the Specification

In Column 19, Line 7, after "sizes" insert -- . --.

In the Claims

In Column 33, Line 57, in Claim 8, delete "corresponds to a" and insert -- dictates a respective --, therefor.

In Column 33, Line 58, in Claim 8, delete "techniques;" and insert -- techniques to be tested during a testing phase; --, therefor.

Signed and Sealed this  
Fifteenth Day of August, 2017

Joseph Matal  
*Performing the Functions and Duties of the*  
*Under Secretary of Commerce for Intellectual Property and*  
*Director of the United States Patent and Trademark Office*